United States Patent
Ogawa et al.

(10) Patent No.: US 6,532,182 B2
(45) Date of Patent: Mar. 11, 2003

(54) SEMICONDUCTOR MEMORY PRODUCTION SYSTEM AND SEMICONDUCTOR MEMORY PRODUCTION METHOD

(75) Inventors: Sumio Ogawa, Higashihiroshima (JP); Shinichi Hara, Shimonoseki (JP)

(73) Assignee: NEC Corporation, Tokyo (JP)

( * ) Notice: Subject to any disclaimer, the term of this patent is extended or adjusted under 35 U.S.C. 154(b) by 9 days.

(21) Appl. No.: 09/811,529

(22) Filed: Mar. 20, 2001

(65) Prior Publication Data

US 2001/0026486 A1 Oct. 4, 2001

(30) Foreign Application Priority Data

Mar. 21, 2000 (JP) .......................... 2000-079020

(51) Int. Cl.[7] ............................... G11C 7/00
(52) U.S. Cl. ................... 365/201; 365/200; 700/121
(58) Field of Search ................. 365/201, 200; 700/121; 702/185; 716/4

(56) References Cited

U.S. PATENT DOCUMENTS

| | | |
|---|---|---|
| 5,493,236 A | 2/1996 | Ishii et al. |
| 5,787,190 A | 7/1998 | Peng et al. |
| 5,795,797 A | 8/1998 | Chester et al. |
| 6,108,253 A1 * | 8/2002 | Ohta ................. 365/201 |

FOREIGN PATENT DOCUMENTS

| | | |
|---|---|---|
| JP | 6-18230 | 3/1994 |
| JP | 7-085697 | 3/1995 |
| JP | 10-339943 | 12/1998 |
| JP | 11-054919 | 2/1999 |
| WO | WO 96/41204 | 12/1996 |

* cited by examiner

Primary Examiner—Vu A. Le
(74) Attorney, Agent, or Firm—Foley & Lardner

(57) ABSTRACT

A semiconductor memory production system is provided, capable of holding the data necessary for process analysis for each lot in chronological order using a small amount of information, and which enables production management based on data that has been stored previously without performing new measurements. The semiconductor memory production system comprises: an LSI tester 1 that tests semiconductor memory and outputs the addresses of memory cells for each chip and a pass/fail bitmap corresponding to these addresses, and a process defect estimating device 34 that extracts the bit addresses of fail bits from the bitmap, and determines replacement addresses of word lines and bit lines to be replaced by redundant word lines and redundant bit lines in the redundant memory section, and estimates process defects from statistical analysis of the distribution condition of each chip on each wafer. Through this estimated result, feedback to the manufacturing line/process step prevents from producing defects frequently.

12 Claims, 24 Drawing Sheets

FIG. 3

| PRODUCT NAME | LOT NUMBER | WAFER NUMBER | STEP NAME | MANUFACTURING TIME AND DATE | MANUFACTURING MACHINE NO. | MANUFACTURING CONDITION |
|---|---|---|---|---|---|---|
| UPD123 | CB95-3030 | W01 | STEP A | 20000101 | MACHINE NO. H5 | 5021 |
| | | | STEP B | 20000102 | MACHINE NO. L7 | 4791 |
| | | | ... | ... | ... | ... |
| | | W02 | STEP A | 20000101 | MACHINE NO. H6 | 5021 |
| | | | STEP B | 20000102 | MACHINE NO. L7 | 4791 |
| | | ... | ... | ... | ... | ... |
| | ... | ... | ... | ... | ... | ... |
| ... | | | | | | |

FIG. 5

| PRODUCT NAME | LOT NUMBER | WAFER NUMBER | CHIP NUMBER | TEST ITEM | TEST TIME AND DATE | TEST TIME AND DATE TEST MACHINE NO | TEST CONDITION | TEST RESULT | JUDGMENT RESULT |
|---|---|---|---|---|---|---|---|---|---|
| UPD123 | CB95 -3030 | W01 | C06, 31 | ITEM A | 20000103 | MACHINE NO. T4 | 7252 | 28 | PASS |
| | | | | ITEM B | 20000103 | MACHINE NO. T4 | 5834 | PASS | |
| | | | | ... | ... | ... | ... | ... | |
| | | | C06, 32 | ITEM A | 20000103 | MACHINE NO. T4 | 7252 | 34 | FAIL |
| | | | | ITEM B | 20000103 | MACHINE NO. T4 | 5834 | FAIL | |
| | | | ... | ... | ... | ... | ... | ... | ... |
| ... | ... | ... | ... | ... | ... | ... | ... | ... | ... |

← WAFER CHIP NUMBER →  ← WAFER TEST INFORMATION →

FIG. 7

| FAILURE DISTRIBUTION PATTERN | FAILURE CAUSE | IMPROVEMENT AREA |
|---|---|---|
| A 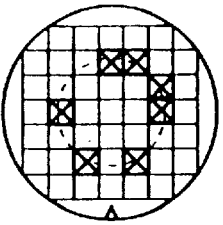 | WHEN PROCESSING SOLVENT IS COATED ON WAFER, LIQUID LEFT IN NOZZLE DRIPS AND MAKES FILM THICKNESS INCONSISTENT, AND HENCE CONTACT FAILURE OCCURS. | ·RESIST COATING DEVICE<br><br>·SOG FILM CREATING DEVICE |
| B 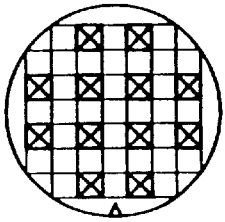 | WHEN A PLURALITY OF CHIPS IS EXPOSED AT THE SAME TIME IN RETICLE, IF A PART OF RETICLE IS DEFECTIVE, FAILURES OCCUR AT A SPECIFIC LOCATION IN EACH EXPOSURE. | ·RETICLE |
| C 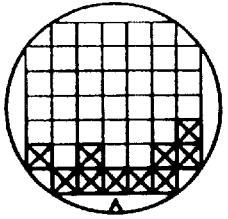 | WHEN VERTICALLY MOUNTED WAFER IS IMMERSED IN PROCESSING LAYER, DIFFERENCE IN PROCESSING TIME OCCURS BETWEEN UPPER AND LOWER PART OF THE WAFER, AND HENCE FAILURES OCCUR CONCENTRATED IN THE UPPER PART OR LOWER PART. | ·WET ETCHING DEVICE /PROCESS<br><br>·BATCH TYPE CLEANING DEVICE /PROCESS |
| D 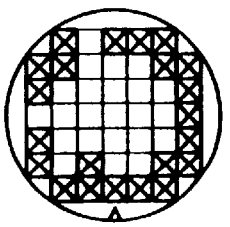 | IN THE PLASMA ETCHING DEVICE, ELECTRIC FIELD BECOMES INCONSISTENT IN THE PERIPHERY OF THE WAFER, AND HENCE FAILURES OCCUR IN THE PERIPHERY OF THE WAFER. | ·PLASMA PROCESSING DEVICE |
| ⋮ | ⋮ | ⋮ |

FIG.8

| FAILURE DISTRIBUTION PATTERN | | FAILURE CAUSE | IMPROVEMENT AREA |
|---|---|---|---|
| K | [bar chart: NUMBER OF FAULTS vs WAFER NUMBER, 0 2 3 4 5 ... 25, tall bar at 0 near 30] | IN BATCH TYPE PROCESS STEP, PROCESSING LIQUID /GAS BECOMES INCONSISTENT BETWEEN THE FIRST WAFER AND THE SECOND AND LATER WAFERS SO THAT FAILURES OCCUR FREQUENTLY ONLY ON THE FIRST WAFER. | ·BATCH TYPE WET ETCHING DEVICE/PROCESS ·BATCH TYPE THERMAL DIFFUSION DEVICE/PROCESS ·BATCH TYPE THERMAL OXIDATION DEVICE/PROCESS ·FURNACE TUBE |
| L | [bar chart: NUMBER OF FAULTS vs WAFER NUMBER, 0 2 3 4 5 ... 25, bars at 2, 4, and 25] | IN SINGLE WAFER TYPE PROCESSING DEVICE, IF A SPECIFIC MACHINE IS FAULTY, FAILURES OCCUR FREQUENTLY FOR THE MACHINE NUMBER. | ·SINGLE WAFER TYPE CVD DEVICE/PROCESS ·SINGLE WAFER TYPE EXPOSURE DEVICE/PROCESS ·SINGLE WAFER TYPE ETCHING DEVICE/PROCESS |
| ⋮ | ⋮ | ⋮ | ⋮ |
| P | [line chart: NUMBER OF FAULTS vs DATE OF MANUFACTURE, 1 2 3 4 5 ... 25, two peaks] | IN A SPECIFIC TEST ITEM AND MANUFACTURING EQUIPMENT, IF THERE IS FRICTION AND THE LIKE IN THE EQUIPMENT, FAILURE RATE INCREASES OVER TIME. | ·VACUUM PACKING EQUIPMENT ·OBSOLESCENCE OF LIQUID IN PROCESS WITH RECIRCULATING ETCHING LIQUID ·SENSITIVITY OF SENSOR DROP |
| ⋮ | ⋮ | ⋮ | ⋮ |

FIG. 11

ROW FUSE FIRST NO. ("F101". GR1)

ROW FUSE FIRST NO. ("F109". GR2)

．
．
．

COL FUSE FIRST NO. ("F501". GL1)

COL FUSE FIRST NO. ("F509". GL2)

```
PRODUCT NAME
LOT NAME    ("LOT NO", LOT NAME)
WAFER NO.   ("W0001")
VREF FUSE NO.  ("FY101")
VREF FUSE NO.  ("FY102")
            ⋮
CHIP NO.   ("CA001")
ROW FUSE NO.  ("F101")
ROW FUSE NO.  ("F103")
ROW FUSE NO.  ("F106")
ROW FUSE NO.  ("F108")
ROW FUSE NO.  ("F110")
ROW FUSE NO.  ("F112")
ROW FUSE NO.  ("F113")
ROW FUSE NO.  ("F115")
            ⋮
COL FUSE NO.  ("F500")
COL FUSE NO.  ("F502")
COL FUSE NO.  ("F505")
COL FUSE NO.  ("F507")
COL FUSE NO.  ("F509")
COL FUSE NO.  ("F512")
COL FUSE NO.  ("F514")
COL FUSE NO.  ("F516")
            ⋮
TERMINATION DELIMITER OF WAFER INFORMATION ("/E")
```

FIG. 13

R100 — LOT NO. ("CB-10")
R101 — WAFER NO. ("W01")
R102 — CHIP NO. ("C5, 20")
R103 — VREF ADDRESS ("FY101", "FY103", ...)
R104 — NUMBER OF ADDRESSES ("3")
R105 — WORD LINE ADDRESS NO. ("21", "1A", "3A", ...) : NUMBER OF ADDRESSES ("4")
R107 — BIT LINE ADDRESS NO. ("5A", "CB", "D2", ...) : NUMBER OF ADDRESSES ("10")
R109 — CHIP NO. ("C6, 20") : VREF ADDRESS ("FY102", "FY103", ...) , NUMBER OF ADDRESSES ("1")
R110 — TOTAL NUMBER OF CHIP ADDRESSES ("243")
R111 — ("/E")
R112 — WAFER NO. ("W02")
CHIP NO. ("C5, 20") : VREF ADDRESS ("FY101", "FY102", ...) , NUMBER OF ADDRESSES ("2")
R113 — TOTAL NUMBER OF CHIP ADDRESSES ("521")
R114 — ("/E")
R115 — ("EOF")

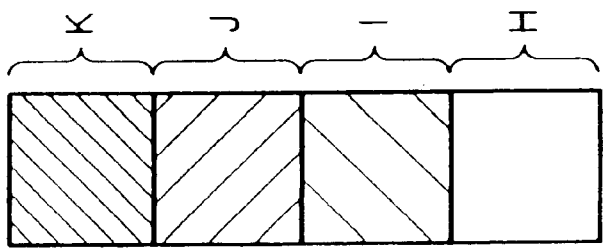
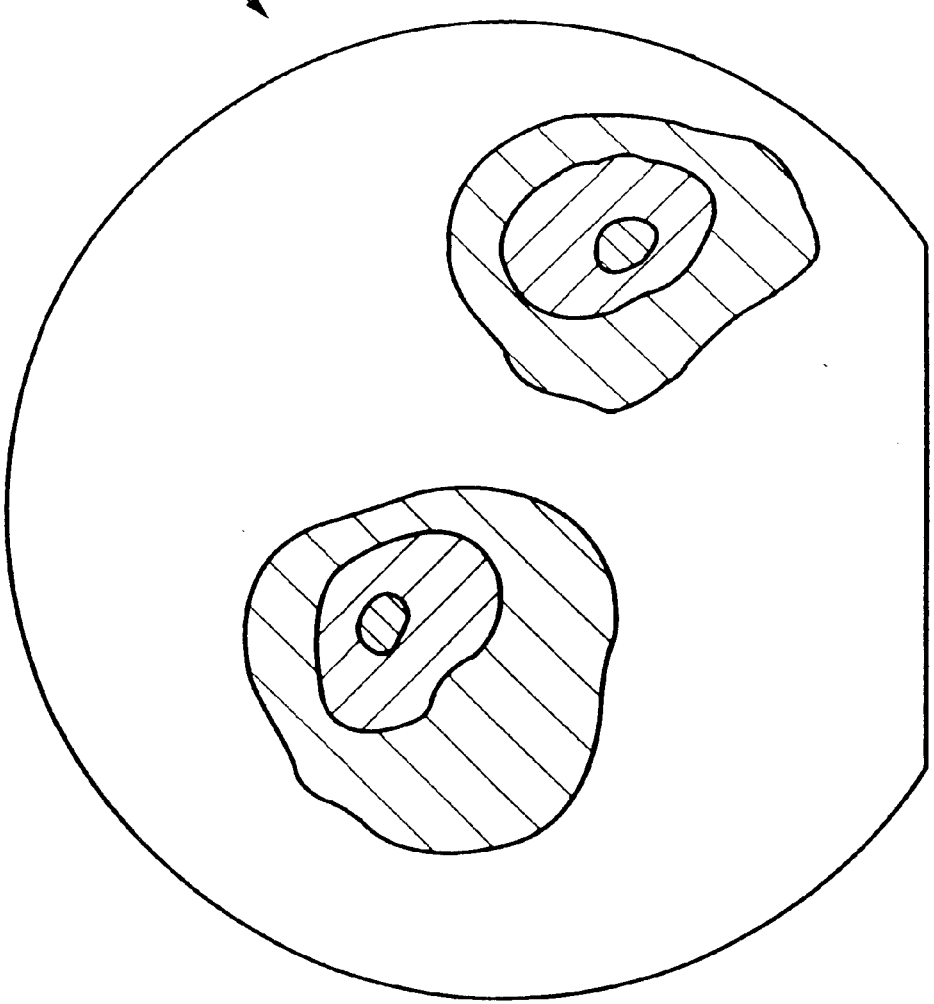

SEMICONDUCTOR MEMORY PRODUCTION SYSTEM AND SEMICONDUCTOR MEMORY PRODUCTION METHOD

BACKGROUND OF THE INVENTION

1. Field of the Invention

The present invention relates to a semiconductor memory production system, and a production method thereof, that infers the step in a wafer process that caused a defective semiconductor memory cell.

2. Description of the Related Art

In recent years, to improve the storage capacity of semiconductor memory, considerable effort has gone into the miniaturization of memory cells formed on chips.

If the development of a plurality of process steps (wafer process) necessary for the production of these miniaturized semiconductor memories and stabilization of these process steps are not performed rapidly, it is difficult to ship the required semiconductor memories at the time they are required.

Therefore, for the development and stabilization of each process step necessary for the production of semiconductor memory, it is essential to perform failure analysis of the semiconductor memory, and using the result obtained from this failure analysis repair the defect in the process step that caused the failure.

In general, judgment of whether the memory cells of a semiconductor memory are good or bad is performed such that predetermined data ("0", "1") is written to each memory cell bit by an LSI tester, then subsequently data is read out from this memory cell, and the two are compared to determine whether they match. The case where they match is designated as "pass bit", the case of mismatch is designated as "fail bit".

Various kinds of failure analysis are performed in respect of each individual semiconductor memory wherein the distribution condition of fail bits is generated and displayed in accordance with the arrangement of the memory cell array. This arrangement is called a fail bitmap, or just bitmap.

Japanese Examined Patent Application, Second Publication No. 6-18230 (hereunder referred to as First Prior Art) discloses a functional test performed automatically for all the chips in one wafer, and the test result is stored in a fail bit memory, and/or displayed on a screen and/or printed. At this time, for display in a limited area, the fail bit memory is divided into n×n blocks, and each block indicates the existence of a fail bit. Furthermore, when the contents of the fail bit memory are stored on an external storage device, to save memory capacity, one bit in one word (byte) corresponds to one bit of memory.

For example, with a 128 M bit semiconductor memory, the bitmap is 16 Mbytes for one chip. For one wafer (200 chips), 3.2 Gbytes of memory capacity is required, and for 1 lot (50 wafers), 160 Gbytes. Furthermore, if divided into 88 blocks, the memory capacity is 2.5 Gbytes per one lot, and the memory capacity can be reduced to ⅟₆₄th.

Japanese Unexamined Patent Application, First Publication No. 7-85697 (hereunder referred to as Second Prior Art) discloses a method of performing rapid failure analysis. In a memory map of a conventional semiconductor memory, fail bits with different failure modes, which have been caused by different failure causes, are mixed. As a result, the addresses are displayed as fail bits with different failure causes mixed in the abovementioned "fail bitmap", which makes it difficult for a designer to identify the "failure mode" generated based on this "fail bitmap", and further to infer the cause of the defect.

Here, "failure mode" means a unique fail bit distribution condition that appears in the case where a semiconductor memory having a specific failure, such as a defect etc., is tested in a predetermined condition, and it is known from experience that it shows different distribution conditions depending on the failure cause. For example, it includes a single bit failure in which there exists no fail bit before and after a target fail bit, a pair bit failure in which there exists a series of two fail bits, line failure (data line failure, or word line failure) in which there are more than three continuous bits and the like. Furthermore, the aforementioned "fail bitmap" is known as one of the devices suitable for identifying the distribution condition of fail bits.

Moreover, with the development of mass storage in recent semiconductor memory, this fail bitmap develops into a vast amount of data. Consequently, even if the First Prior Art is applied, it is difficult to output (print, display by CRT) the whole semiconductor memory as a fail bitmap at one time, which makes the operation of identifying the failure mode complicated. Furthermore, when analyzing the cause of the failure mode, the occurrence conditions must be analyzed for each individual fail bit. Therefore, there are also problems in that as the abovementioned "fail bitmap" becomes larger, the bitmap processing time in this analysis operation is greatly increased, and the analysis efficiency is reduced.

On the other hand, for a method to display the whole memory easily, a display method of a so-called "compressed bitmap" in that the fail bitmap is summarized is proposed in the First Prior Art. In this compressed bitmap, a plurality of bits in memory is converted into one unit of a compressed bit, and the object fail bitmap is compressed by a predetermined ratio. The display method using this compressed bitmap can display the distribution condition of the fail bits of the whole memory map concerned. However, the detail of the occurrence conditions cannot be detected (for example, it cannot be judged whether the digest bit displays one fail bit or a plurality of fail bits). Consequently, to analyze the cause of failure, one to one display of the "fail bitmap" is required, so that the failure mode analysis operation by a designer remains complicated.

To solve these problems, in the Second Prior Art, firstly a test is performed under predetermined measurement conditions. In the case where it is judged to be defecty, fail bit data are obtained. Here, in most cases the obtained fail bit data are fail bit data of compound failure modes in which a plurality of failure causes are intermixed. Therefore, an algorithm that detects a specific "failure mode" as a target is generated by a combination of address theory and the like, with which specific failure mode data are extracted, and fail bit data corresponding to the specific failure mode are obtained from the fail bit data initially obtained.

From the fail bit data in which various types of failure modes are intermixed, firstly pair bit failure mode is extracted, which is further classified into even number-odd number defect address pairs, or odd number-even number pairs. Then, if there is no pair bit defect, the defect is classified as a single bit failure address. If a series of defecty bits exists, it is classified as a line failure mode. By classifying in this manner, a failure corresponding to a specific failure mode can be extracted, hence it is easy to identify the occurrence conditions of the specific failure. Furthermore, the fail bitmap can be classified by failure mode for display at wafer scale.

With the Second Prior Art, the memory capacity can be small in comparison with the bitmap. However, the memory capacity changes greatly by failure mode. For example, with a 128 M bit semiconductor memory, 27 bytes are required to display one bit address. In a supposed case where one k byte of fail bits are scattered in one chip, 27 kbytes of memory capacity is required. For one wafer (260 chips) 675kbytes, and for one lot (50 wafers) 33 Mbytes of memory capacity is required. Furthermore, in the case where the fail bits are all pair defects, the memory capacity becomes half of this, so that 17 Mbytes of memory capacity is required.

Moreover, with the Second Prior Art, to extract the failure mode, a vast amount of time is required. For example, in the case where one k byte of fail bits exists, the algorithm that is shown in the drawing in the publication must be repeated thousands of times.

The following publication describes a method for estimating a defecty process step in a manufacturing process by utilizing defect information and the like that are detected by the above method.

Japanese Unexamined Patent Application, First Publication No. 11-45919 (hereunder referred to as Third Prior Art) discloses, where a semiconductor substrate (wafer) is manufactured by a manufacturing line comprising a plurality of manufacturing equipment and required manufacturing processes (process steps), a method based on: a test step for testing the locations at which defects occur on each semiconductor substrate with regard to a plurality of semiconductor substrates manufactured; a failure distribution image data creation step for creating failure distribution image data, in which the failure location data on each semiconductor substrate tested by the test step is assigned a coordinate on the image data composed of grid-like picture elements set on the semiconductor substrate, and the number of failures for each grid-like picture element on the image data is summed for a plurality of semiconductor substrates; a failure analysis step that compares the failure distribution image data created by the failure distribution image data creation step with a case data base of a plurality of prepared failures and can investigate and estimates the cause of a failure occurrence.

For example, as shown in FIG. 23, if the failure distribution of a wafer 100 is in a pattern 311, by collating with a history data base created in the past for analysis purposes, it can be estimated that there is a failure cause in step A, and if it is in a pattern 313, that there is a cause in step C.

Furthermore, in the case where there is a step in which one lot is processed by single wafer processing in a plurality of the same type of manufacturing equipment, as shown in FIG. 24, if the failure distribution of the pattern 315 is larger than the pattern 314, depending on the manufacturing machine, it can be estimated that there is a cause in a manufacturing machine B.

In this manner, by knowing the distribution of defective cells on the wafer, and the distribution of the wafers in this lot, it is possible to infer the process step in which a memory cell becomes defective.

Japanese Unexamined Patent Application, First Publication No. 10-339943 (hereunder referred to as Fourth Prior Art) discloses a semiconductor memory manufacturing method having a step for performing a stepper type projection exposure using masks or reticules, wherein the chip coordinates are used to identify the chip location on the exposed semiconductor wafer, and it is judged whether the defect concerned is caused by a mask or reticule or not, from the chip coordinate data of the defecty chips that are distributed on the exposed semiconductor wafer, so that the location of a defect on the mask or reticule can be detected easily in a short period.

The stepper type exposure equipment operates by printing the pattern on a reticule 101 onto the wafer 100. At this time, as shown in FIG. 25, to reduce the number of exposures, a plurality of chips (4 chips in the figure) is reduced and exposed at the same time. By exposing the reticule 101 on the wafer 100 successively, a pattern is formed on the whole wafer.

For example, as shown in FIG. 25, in the case where the semiconductor memory on the wafer 100 is periodically judged to be defecty, it is estimated that it is caused by the mask or reticule 101, assuming that four semiconductor memory patterns (exposure units) are formed on the reticule 101, and that there is a defect in a specific region 101a. Printing on the resist on a wafer by a stepper using this reticule 101, as shown in FIG. 25, a specific location in each exposure unit on the wafer becomes periodically defective. Here, in FIG. 25, a chip marked "x" indicates a defecty chip.

Furthermore, in a lot that is processed at one time, in the case where defecty semiconductor memories are concentrated in the lower part 102 of the wafer 100 on all wafers contained in this lot, as shown in FIG. 26, it is estimated that the cause is an immersion type wet etching step, in which wafers stand vertically. The reason is considered to be as follows.

In wet etching during resist removal or oxide removal when a wafer is immersed in an etching liquid, the wafer is immersed from the lower part 102 and the upper part is submerged at the end. Therefore, the lower part of the semiconductor memory chip is immersed in the etching liquid for longer than the upper part, so that the period that it is etched by the etching liquid is also longer. Consequently, the pattern and thin film of the lower part 102 of the wafer is etched excessively.

Moreover, in the case where the number of semiconductor memories that are judged to be defecty on a wafer W1 is much higher compared with any other one of the wafers W2 through W25, it is estimated that the cause is that, as shown in FIG. 27, wafer W1 through W25 are placed in a line in phase direction in a boat 103 (at this time, the direction of an arrow marked A is the phase of the wafer W1 through W25) to perform wet etching. This is caused because, with regard to the surface that has semiconductor memory circuits on the wafer W1, the space is not enclosed compared with the surfaces of the other wafers, and hence a lot of activated etching liquid is applied.

In addition, for those other than the wafer W1 there is another wafer above the wafer surface, so that the supply of etching liquid is limited compared with the wafer W1.

Furthermore, in a drying process after submersion in the etching liquid, other cleaning processes and the like, differences depending on whether the processing face of a wafer is exposed at the front may appear.

As mentioned above, depending on the chip location on the wafer of a semiconductor memory that is judged to be defecty, and depending on the location of the a wafer in the lot, it is possible to infer which process step is the cause of failure.

Currently, with failure analysis of the process steps, estimation of the process step that is the cause of defecty semiconductor memory is performed based on test results in the wafer state.

Furthermore, a conventional failure analysis system detects the location of defecty semiconductor memory chips on a wafer based on bitmap information showing all defecty bits of the semiconductor memory chips input from the semiconductor test equipment,.

However, in the case of applying the failure analysis method shown in the Third and Fourth Prior Arts to a large capacity semiconductor memory, there is a problem in that a large amount of information must be dealt with. As mentioned above, in the case of storing one lot of bitmap information for a 128 M bit semiconductor memory with the First Prior Art, the amount of information is 2 to 3 Gbytes. To store such a large amount of information chronologically over a long period for analysis, it is difficult to process using a cheap personal computer, so an expensive information processing system must be introduced.

Furthermore, with the Second Prior Art, the amount of information differs greatly depending on the arrangement of fail bits, in other words, the failure mode. However, it is estimated to be about 15 K bytes per one chip, and 140 through 150 Mbytes per one lot. In the Second Prior Art, the amount of information can be reduced compared with the First Prior Art. However, to analyze the failure mode and compress the information, an expensive information processing system must be introduced and a time consuming arithmetic processing operation performed. Moreover with the Second Prior Art, with only a visual check of the failure mode analysis result, it cannot be judged whether the failure can be remedied by redundant circuits, or cannot be remedied.

Moreover, to reduce the amount of data storage per lot, it can be considered that only the yield data of each wafer needs to be stored chronologically in order to control lot yield.

In controlling just the yield of each wafer mentioned above, by the change in yield of lots stored periodically it is possible to detect a downward tendency in the yield caused by an abnormality of the whole wafer process, deterioration of manufacturing equipment and the like, so that failure analysis of the wafer process can be performed.

However, in process analysis or failure analysis to detect abnormal processes, since each chip on a defecty wafer is tested by a failure analyzer installed at a different location from the semiconductor production line, the number of analyses is increased.

Furthermore, with conventional failure analysis, a semiconductor memory that is judged defecty by a tester is selected and separated, and is retested by a failure analysis tester to analyze the cause of failure. Therefore, there is no notice until the yield in a wafer manufacturing line becomes worse, or a large amount of defecty product appears. Consequently, in the case where a large amount of defecty product appears, a situation occurs wherein semiconductor memories cannot be supplied to users.

SUMMARY OF THE INVENTION

The present invention has come about under such a background, with the object of providing a semiconductor memory production system that can maintain the data necessary for process analysis of each lot chronologically, and also enable failure analysis based on data already stored, without performing new measurements.

A first aspect of the invention is a semiconductor memory production test system in which there is provided: a wafer manufacturing line for manufacturing a plurality of semiconductor memory chips on a wafer using a plurality of kinds of wafer manufacturing equipment; a wafer tester for testing the electrical characteristics of the chips; a replacement address decision device for determining replacement addresses in a redundant memory section installed in the semiconductor memory based on the test results of the wafer tester; and an estimation section for estimating the cause of failures based on results of statistical processing of the replacement addresses, wherein the wafer manufacturing equipment causing failures is identified in the wafer manufacturing line and the cause of failures is removed.

A second aspect of the invention is a semiconductor memory production system according to the first aspect, wherein the estimation section is provided with a defect distribution analyzer for generating a replacement address distribution based on the replacement addresses, and a process defect estimation device for estimating process defects by comparing the replacement address distribution with previously stored defect distribution patterns.

A third aspect of the invention is a semiconductor memory production system according to the second aspect, wherein there is provided a defect distribution analyzer for generating a replacement number for specific replacement addresses in the wafer.

A fourth aspect of the invention is a semiconductor memory production test system according to the first aspect, wherein there is provided a defect distribution analyzer for generating a history of the replacement number.

A fifth aspect of the invention is a semiconductor memory production system, wherein semiconductor memories manufactured on wafers are tested, the test results are statistically processed to estimate the causes of defects, and the causes of the defects are removed from the wafer manufacturing equipment, wherein there is provided a semiconductor test section that tests the semiconductor memories and outputs a bitmap showing the fail or pass results judged from the address of each memory cell in a semiconductor memory, a replacement address decision section that extracts the bit address of a fail bit from the bitmap and, based on this bit address, determines a replacement word line and/or bit line address to be replaced with a redundant word line and/or redundant bit line in a redundant memory section installed in the semiconductor memory, and an estimation section for estimating process defects by statistical analysis based on the replacement number of the exchanged word lines or/and bit lines for each semiconductor memory, which is obtained based on the replacement addresses.

A sixth aspect of the invention is a semiconductor memory production system according to the first aspect, wherein the estimation section is provided with a fuse address setting section for generating fuse addresses showing sections disconnected by fuses that set the addresses of the redundant word lines and/or redundant bit lines for the replacement addresses, and an extraction section for extracting a replacement number of the word lines and/or bit lines exchanged for each semiconductor memory from the fuse addresses, and the distribution condition of each semiconductor memory chip for each wafer.

A seventh aspect of the invention is a semiconductor memory production system according to the first aspect, wherein the estimation section is provided with a pattern formation section that indicates each semiconductor memory chip on the wafer with a color or gradation corresponding to the replacement number.

An eighth aspect of the invention is a semiconductor memory production system according to the first aspect, characterized in that the estimation section compares the replacement number pattern with replacement number patterns stored in advance, which are generated for each process abnormality, and based on the result of this comparison, infers a specific process abnormality.

A ninth aspect of the invention is a semiconductor memory production method comprises: a wafer step for forming semiconductor memories on a wafer through a plurality of process steps; a wafer test step which examines the wafer in the wafer state to select non-defective products; a bitmap output step for outputting, as a result of the test, the address of each memory cell of the semiconductor memory, and a bitmap showing the pass and fail judgment; a replacement address decision step that extracts the bit address of a fail bit from the bitmap, and based on this bit address, determines a replacement word line and/or bit line address to be replaced with a redundant word line and/or redundant bit line in a redundant memory section installed in the semiconductor memory; and a process defect estimation step for estimating a process defect by statistical analysis based on the replacement number of the replaced word lines or/and bit lines for each semiconductor memory, which is obtained based on the replacement addresses.

A tenth aspect of the invention is a semiconductor memory production method according to the ninth aspect, wherein the process defect estimation step is provided with a fuse address setting section for generating fuse addresses showing sections disconnected by fuses that set the addresses of redundant word lines and redundant bit lines for the replacement addresses, and an extraction step for extracting a replacement number of the word lines and bit lines exchanged for each semiconductor memory from the fuse addresses, and the distribution condition of each semiconductor memory chip for each wafer.

An eleventh aspect of the invention is a semiconductor memory production method according to the ninth aspect, wherein the process defect estimation step is provided with a pattern formation section that indicates each semiconductor memory chip on the wafer with a color or gradation corresponding to the replacement number.

A twelfth aspect of the invention is a semiconductor memory production method according to the ninth aspect, wherein the process defect estimation step compares the replacement number pattern with replacement number patterns stored in advance, which are generated for each process abnormality, and based on the result of this comparison, estimates a specific process abnormality.

BRIEF DESCRIPTION OF THE DRAWINGS

FIG. 3 shows the structure of a manufacturing history information file 21 of the present invention.

FIG. 5 shows the structure of a wafer test information file 23 of the present invention.

FIG. 7 shows a failure distribution pattern stored in the failure distribution data base 35 in FIG. 1.

FIG. 8 shows a failure distribution pattern stored in the failure distribution data base 35 in FIG. 1.

FIG. 11 shows the structure of a tabular file wherein fuse start numbers are inserted in redundant word line order.

FIG. 12 shows the structure of an intermediate file that the redundant address analysis device 2 outputs.

FIG. 13 shows the format of an analysis data file that the redundant address analysis device 2 outputs.

FIGS. 19A and 19B are plan views wherein the count of the number of chips in corresponding chip locations in the wafer that need correction of the self refresh cycle time for all the wafers is displayed at the corresponding chip locations on the wafer.

DESCRIPTION OF THE PREFERRED EMBODIMENT

Figure 1:
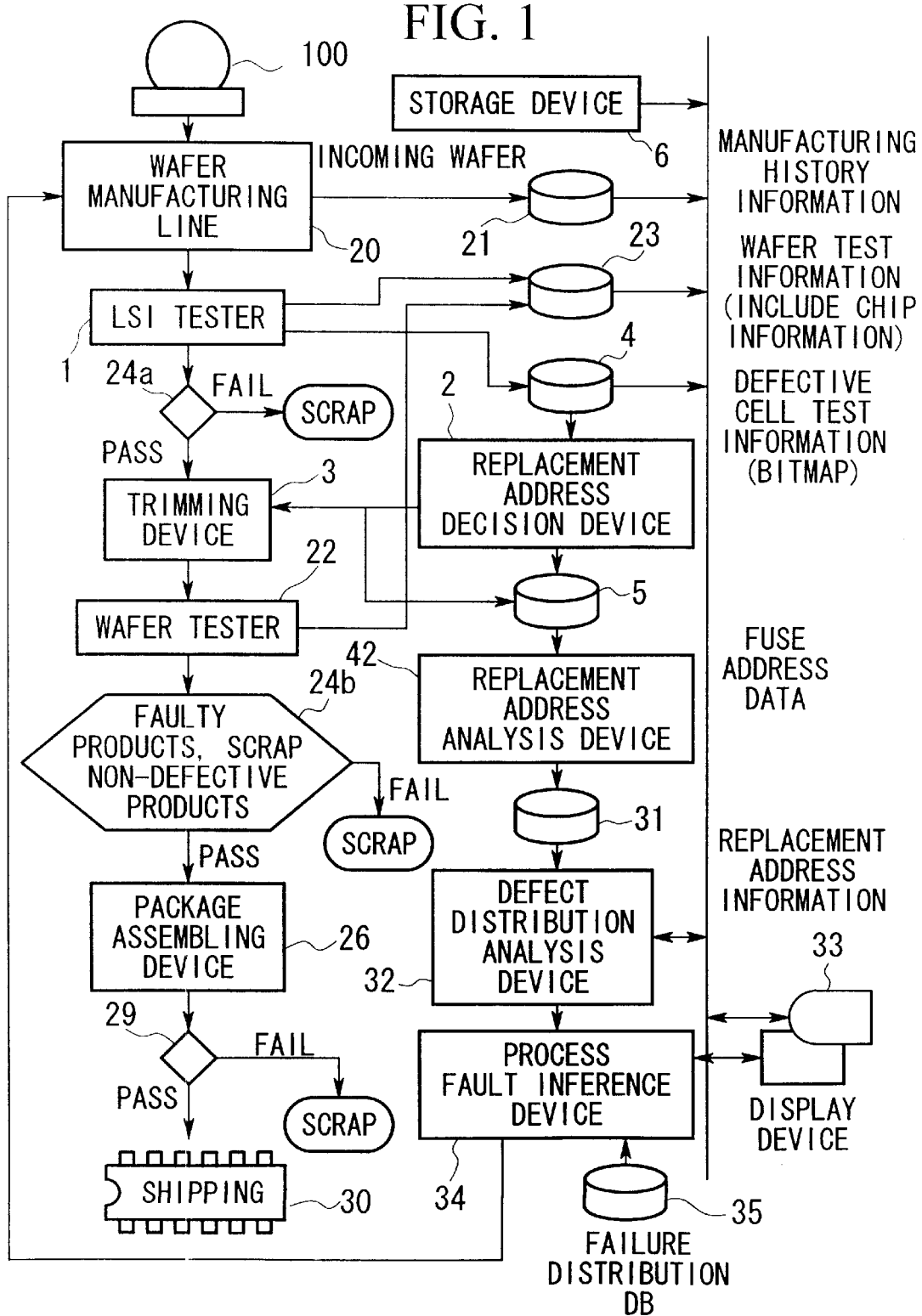
FIG. 1 is a block diagram showing a structural example of a semiconductor memory production system according to an embodiment of the present invention.

As follows is a description of an outline of an embodiment of the present invention with reference to drawings. FIG. 1 is a schematic diagram of a semiconductor memory production system of a first embodiment of the invention, and FIG. 2 is a flow chart of the semiconductor memory production system.

In FIG. 1, a wafer manufacturing line 20 comprises pieces of manufacturing equipment such as exposure equipment, film creating equipment, etching equipment, diffusion equipment and the like, which perform various semiconductor processes on a wafer 100.

Figure 2:
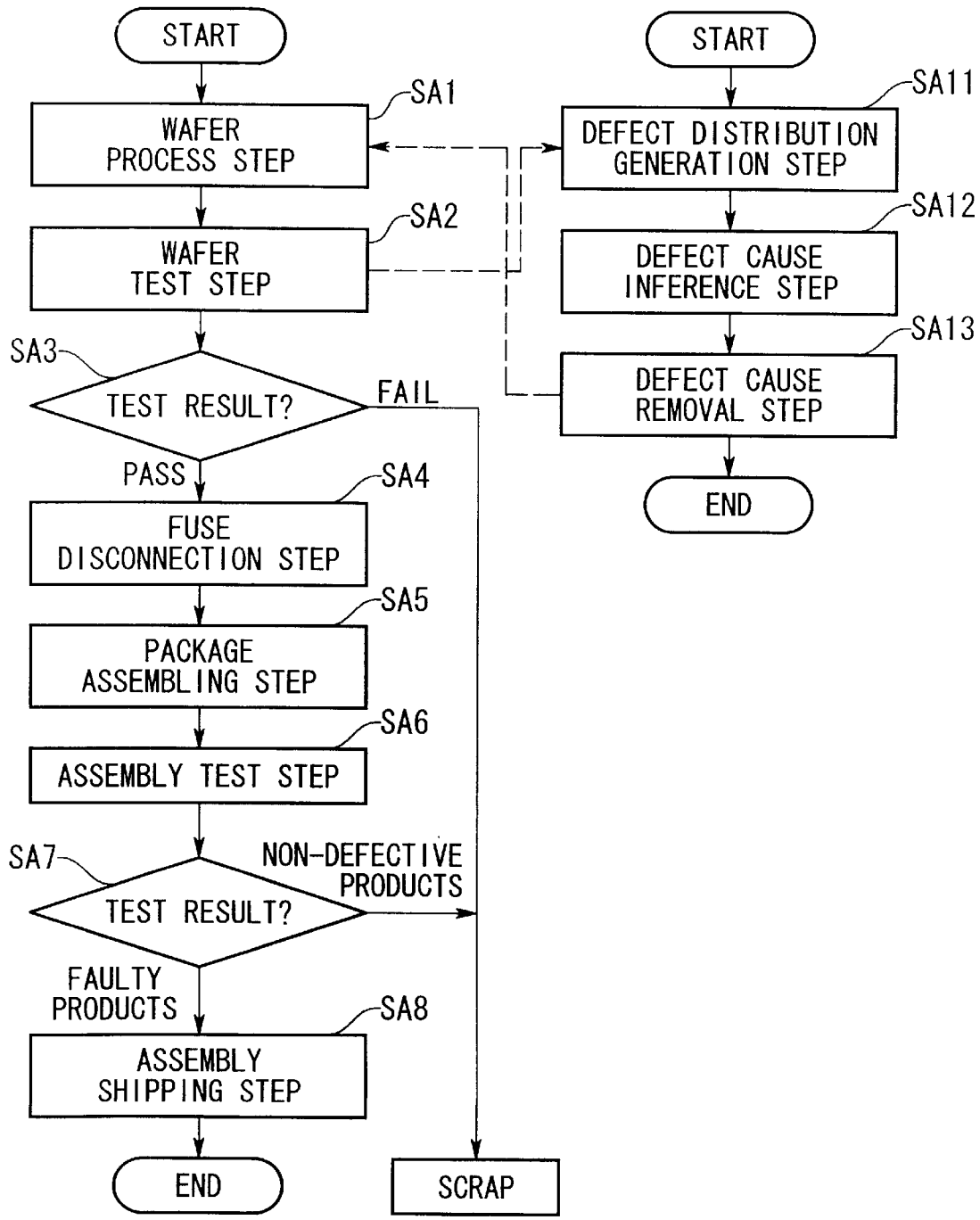
FIG. 2 is a flow chart showing the flow of the semiconductor memory production system.

In process step SA1 of FIG. 2, transistor elements and wires are formed on the surface of the wafer 100, and a wafer is produced on which semiconductor memories are arranged in a grid. Generally, 20 to 50 units of wafer 100 are contained in one carrier, which are put through the wafer manufacturing line 20 as one processing unit (hereunder referred to as lot), and predetermined process steps are performed in predetermined pieces of manufacturing equipment. Each lot is given a predetermined wafer process lot number (hereunder referred to as lot number unless otherwise specified).

The given lot number is displayed on the carrier, and also recorded in a manufacturing history information file 21. The manufacturing history information fail 21, as shown in FIG. 3, stores the product name of the semiconductor memory being the manufacturing object, lot number, wafer numbers being processed, process numbers of the process steps with which this wafer is processed, time and date of process (manufactured time and date), numbers of the equipment used for the process steps (manufacturing machines), manufacturing conditions of the process steps, the specification number, and the like. Here, in the manufacturing history information file 21 and a wafer test information file 23 to be mentioned later, information in one line is designated a record.

Figure 4:
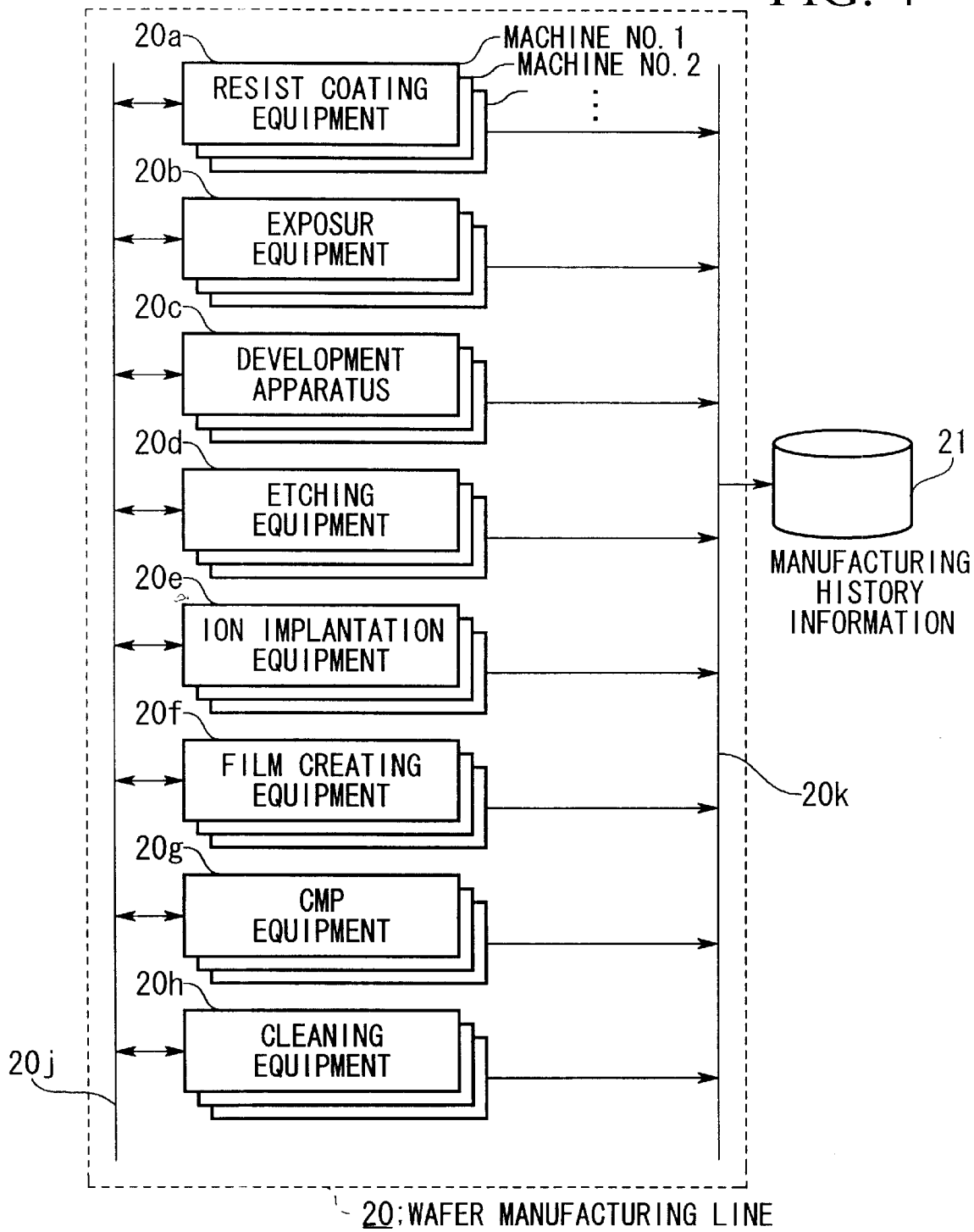
FIG. 4 shows a specific structural example of a wafer manufacturing line 20.

FIG. 4 shows a specific structural example of the wafer manufacturing line 20. The wafer manufacturing line 20 comprises: a resist coater 20a; exposure equipment 20b; a development apparatus 20c; etching equipment 20d; ion implantation equipment 20e; film creating equipment 20f; CMP equipment 20g; cleaning equipment 20h; and the like. For each piece of manufacturing equipment 20a through 20h, a plurality of each type of machine is usually installed to improve the productivity of semiconductor memory manufacture, and each piece of manufacturing equipment is given a machine number (machine number 1, machine number 2, ... ). When a process step is completed a transfer device 20j transfers wafers from manufacturing equipment 20a through 20h to the next step manufacturing equipment 20a through 20h.

The incoming wafer 100 is transferred between the manufacturing equipment 20a through 20h by the transfer device 20j, and a set process SA1 is performed in a predetermined sequence. The manufacturing history is stored in the manufacturing history information file 21 via a communication line 20k.

Returning to FIG. 1, on the surface of the wafer 100 produced in the wafer manufacturing line 20, a plurality of semiconductor memories is arranged in a grid. Hereunder, semiconductor memories are referred to as semiconductor chips, or simply as chips, prior to being assembled into packages. A wafer tester 22 tests the electrical characteristics of wafers on which the formation of semiconductor chips is completed. In this test method, probes contact with input-output pads formed on the semiconductor chips and predetermined test signals are applied to judge whether the output is within a predetermined specification (PASS) or outside of the specification (FAIL).

Each semiconductor chip is given a coordinate on the wafer or a serial number, which is designated the chip number. In a wafer test step SA2 (FIG. 2), the test result of the wafer tester 22 is stored in the wafer test information file 23 with the chip number. The wafer test information file 23 is, as shown in FIG. 5, composed of wafer and chip information and wafer test information. The wafer and chip information stores product names, lot numbers, wafer numbers, and chip numbers, and the wafer test information test items, test date and time, the number (test machine number) of the wafer tester 22 used for the test, test conditions and the specification number, test results, comprehensive PASS/FAIL judgment results, and the like. Furthermore, an LSI tester 1 writes the judgment result of whether each memory cell is a pass bit or a fail bit, that is to say, the fail bitmap information, into a defective cell test information file 4.

In a step SA3, chips that are judged FAIL by the wafer tester 22 are marked by a separator 24, and disposed of in a following step. Furthermore, at the point that the test of the whole of wafer 100 is completed, control proceeds to a defect distribution generation step SA11, a failure cause estimation step SA12, and a failure cause removal step SA13.

In step SA4, a replacement address decision device 2 determines a replacement address to be exchanged with a redundant circuit based on the defective cell test information file 4. The replacement address decision device 2 outputs the replacement address data to a trimming device 3, and also writes it into a fuse address data file 5. The trimming device 3 disconnects a predetermined fuse based on the replacement address data.

After completing the above processes the wafer 100 is cut into a plurality of chips by a dicing device in package assembling equipment 26. A chip that is judged PASS by the wafer tester 22 is mounted onto a lead frame by the package assembling equipment 26, and sealed by resin or the like (FIG. 2, step SA5). Hereunder a semiconductor memory sealed with resin is designated an assembly. The assembly is given an assembly lot number for each processing unit of the assembly process. In step SA7, the assembly is retested by an assembly tester (not shown in the figure), and an assembly 30 that has met the test specification is shipped as a non-defective product (step SA8), while an assembly that has deviated from the test standard is disposed of.

In parallel with the above steps SA1 through SA8 of semiconductor memory manufacturing, steps SA11 through SA13 for performing failure reduction of the manufacturing line and manufacturing processes are performed.

In step SA11, a replacement address analyzer 42 reads out the fuse address data file 5 being in the data format of the trimming device 3, and converts the format to the address format of the semiconductor memory. The replacement address analyzer 42 stores the result of the format conversion in a replacement address information file 31.

A defect distribution analyzer 32 reads out the replacement address information file 31, performs the necessary processing and displays the failure distribution relative to the location of chip numbers on the wafers on a display device 33, accumulating the distribution over one lot for display, displaying the failure distribution for each wafer number, and displaying the change in the failure occurrence rate for each lot number (FIG. 2, step SA11).

A defect distribution data base 35 stores in advance the defect distribution patterns, corresponding failure causes, manufacturing equipment and process steps that generate defects.

A process defect estimation device 34 compares the defect distribution obtained by the defect distribution analyzer 32 with defect distributions stored in the defect distribution data base 35, and extracts the nearest matching failure cause (FIG. 2, step SA12).

An operator of the wafer manufacturing line 20 examines the manufacturing equipment and the process step that is estimated as the failure cause based on this extracted result. The defecty part of the wafer manufacturing line 20 and the process step SA1 are identified and the defect cause is removed. Here, the operator is a person who not only operates the defect analyzer but also improves the operation of the manufacturing equipment and corrects its defects, and may be one person or a plurality of people.

Figure 6:
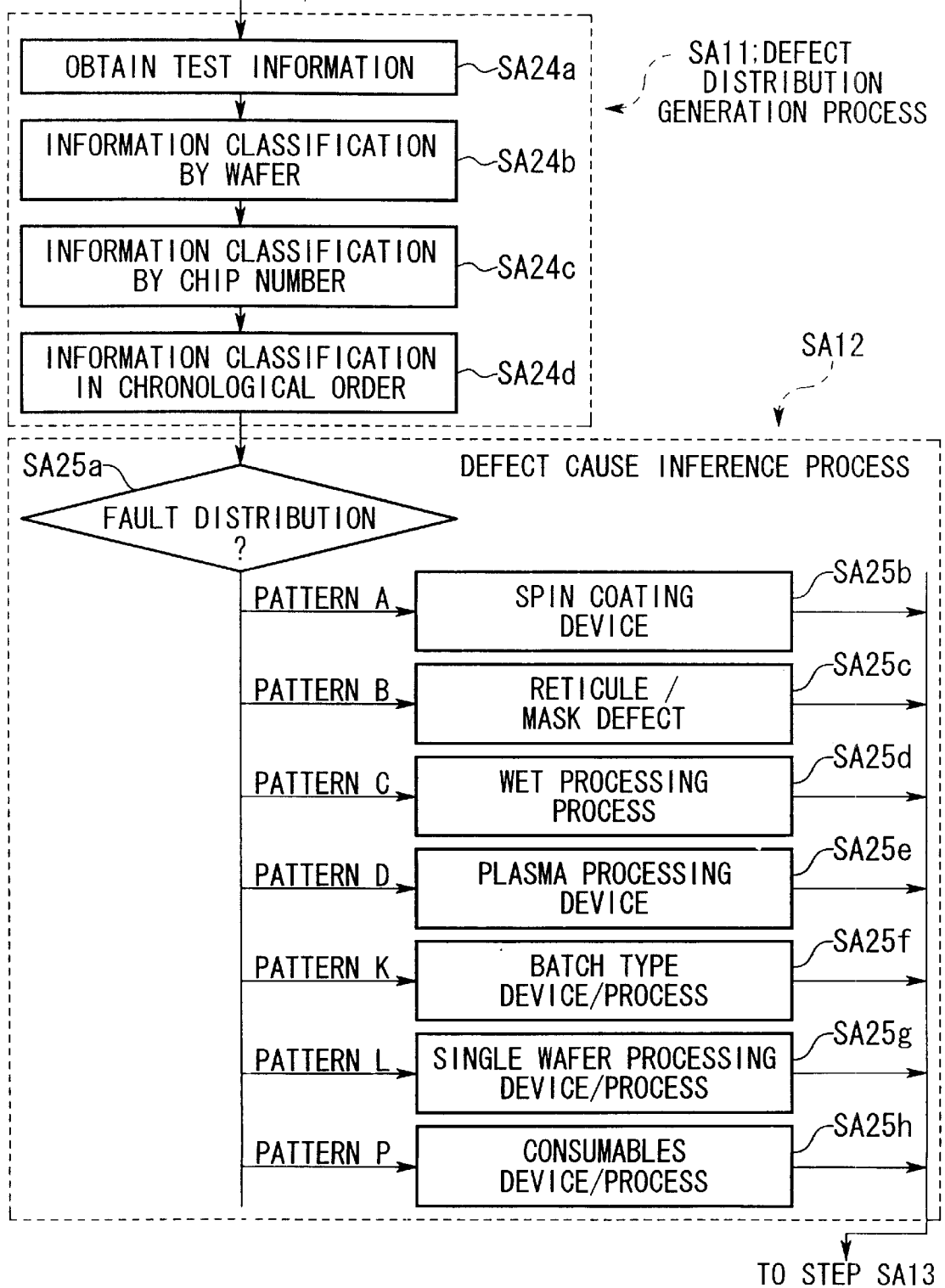
FIG. 6 is a flow chart showing the processing flow of a defect distribution generation process SA24 and a defect cause estimation process SA25.

Next is a description of a detailed flow chart of the defect distribution generation step SA11 and the failure cause estimation step SA12 in FIG. 2 based on FIG. 6. FIG. 6 is a flow chart showing the flow of processing of the defect distribution generation step SA11 and the failure cause estimation step SA12 of FIG. 2.

In step SA24*a*, the defect distribution analyzer 32 obtains replacement address information from the replacement address information file 31.

In step SA24*b*, the defect distribution analyzer 32 classifies the replacement address information by lot number and wafer number. If the relationship between a wafer number and the number of failure occurrences is obtained for a predetermined test item, the graph shown with patterns K and L (failure patterns) in FIG. 8 can be displayed. This graph can display just one specific lot number, and also display the aggregated result of the number of failure occurrences in each lot. With this result, it is possible to analyze whether the failure occurrence in a predetermined lot depends on the wafer location or the processing sequence.

In step SA24*c*, for each wafer number of a predetermined lot, the defect distribution analyzer 32 rearranges test items resulting in failures (FAIL) into chip number order for each test item and each wafer number. The defect distribution analyzer 32 rearranges the replacement address into chip order for each wafer number.

If the relationship between chip number and the number of failure occurrences for a predetermined test item is obtained, it is possible to display the failure locations relative to the wafer as shown by patterns A through D (failure patterns or failure distribution patterns) in FIG. 7. For these failure locations, the arrangement may be such that only a specific wafer number is displayed, or the aggregated result of the number of failure occurrences for each wafer or each lot is displayed. With this result, it is possible to analyze whether the failure occurrences in a predetermined wafer or a predetermined lot depend on the chip location.

In step SA24*d*, the defect distribution analyzer 32 classifies the number (hereunder referred to as replacement number) of replaced word lines and/or bit lines for each lot, each wafer number, or each chip number.

If a change in the replaced number is obtained over time, it is possible to display the change of the number of failure occurrences corresponding to the manufacturing date and time as shown in a pattern P in FIG. 8. For this number of failure occurrences, the arrangement may be such that only a specific lot number, wafer number, or chip number is displayed, or a result of aggregating the number of failure occurrences of each chip, each wafer or each lot is displayed. With this analysis, a change in the number of failure occurrences over time can be recognized, and hence the wafer manufacturing line 20 and the wafer process step SA1 can be maintained before the equipment consumables are damaged, or the processing ability of the processing solvent is diminished. Consequently, a large number of failure occurrences can be prevented beforehand, hence enabling a stable supply of semiconductor memories.

In step SA25*a*, the process defect estimation device 34 compares the defect distribution obtained by the defect distribution analyzer 32 with defect distribution patterns A, B, . . . , P, . . . stored in the defect distribution data base 35, and extracts the nearest matching defect distribution pattern. The defect distribution data base 35 stores, in advance, the defect distribution patterns A, B, . . . , P, . . . as shown in FIG. 7 and FIG. 8 and their corresponding failure causes, the manufacturing equipment and process steps to be improved, and the like.

For example, in the case where the defect is caused by a reticule or mask, the defects and the like, such as individual fail bits, in other words, even the replacement addresses are the same. With the present invention it can be easily detected that there is an abnormality in the stepper exposure device or the reticule in the case of a defect distribution like this.

Figure 22A:
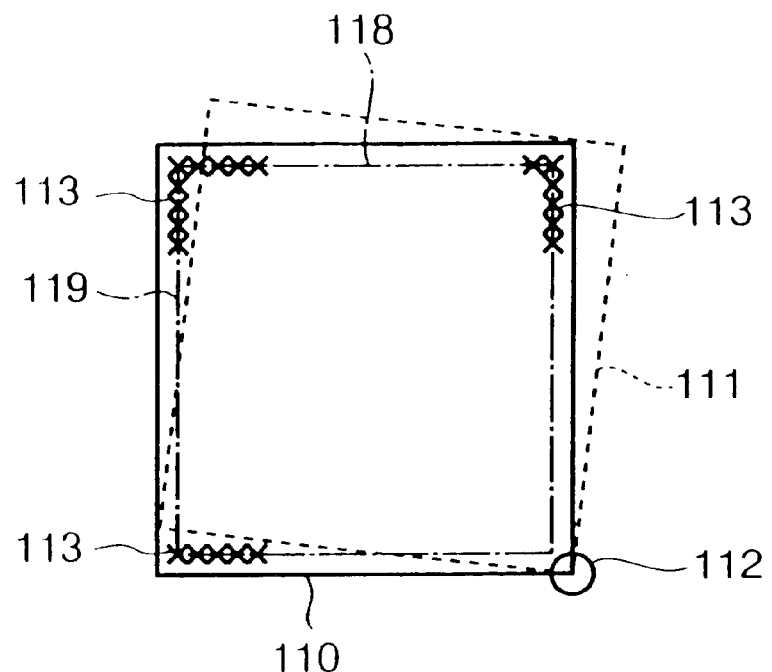
FIGS. 22A and 22B are conceptual diagrams showing the relationship between failure pattern and estimated process defect.
Figure 22B:
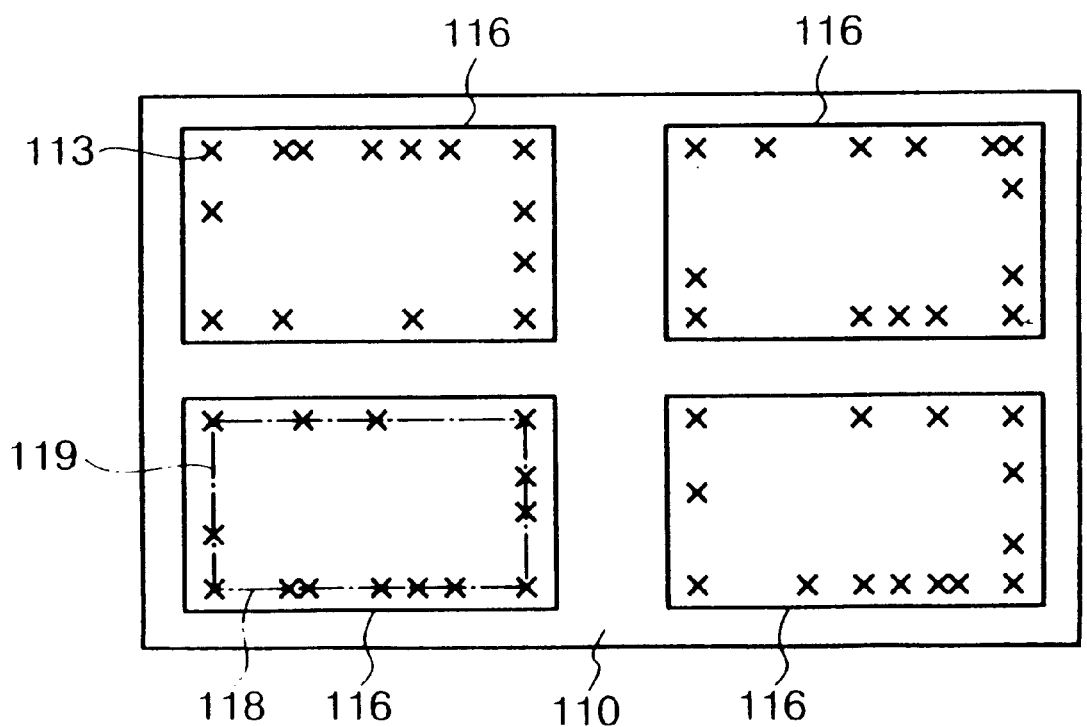
Figure 23:
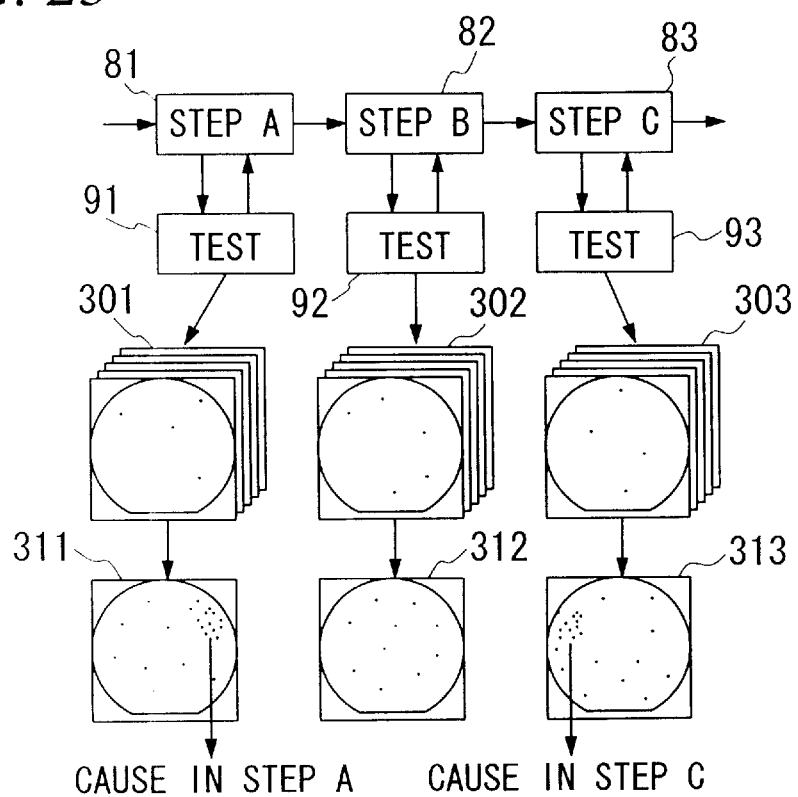
FIG. 23 shows the outline of process defect judgment according to the third prior art example.
Figure 24:
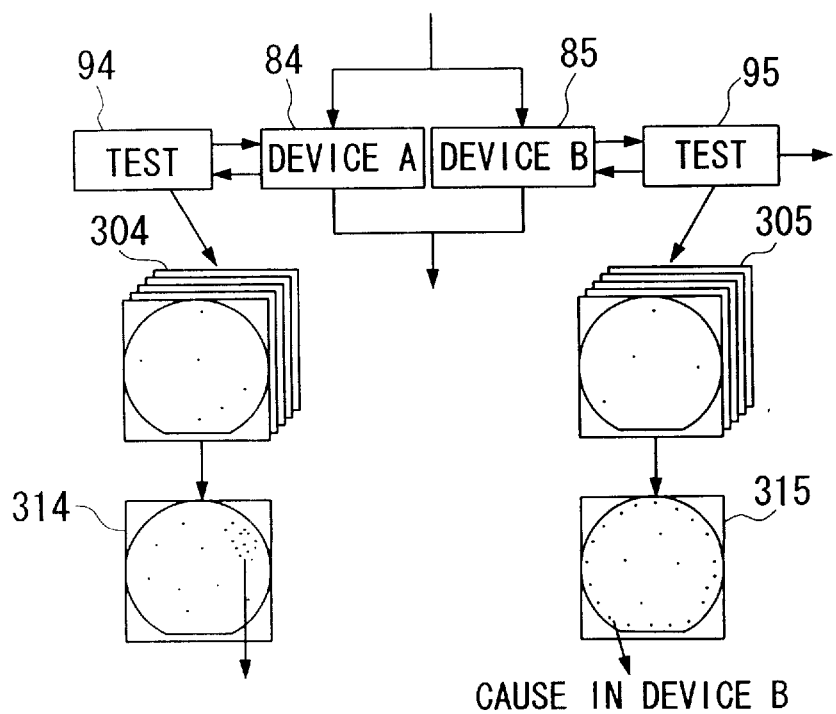
FIG. 24 shows the outline of process defect judgment according to the third prior art example.
Figure 25:
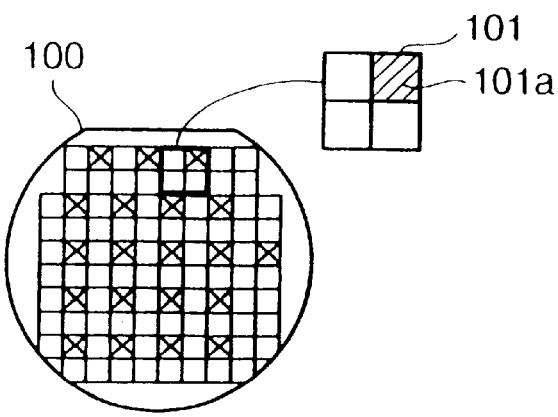
FIG. 25 is a conceptual diagram of a wafer surface showing the arrangement of locations of semiconductor memory chips judged defecty.
Figure 26:
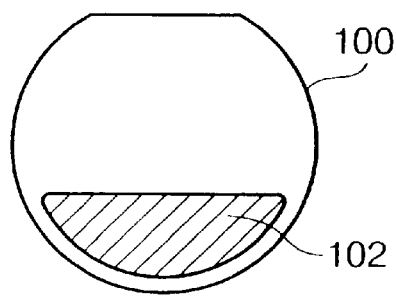
FIG. 26 is a conceptual diagram of a wafer surface showing the arrangement of locations of semiconductor memory chips judged defecty.
Figure 27:
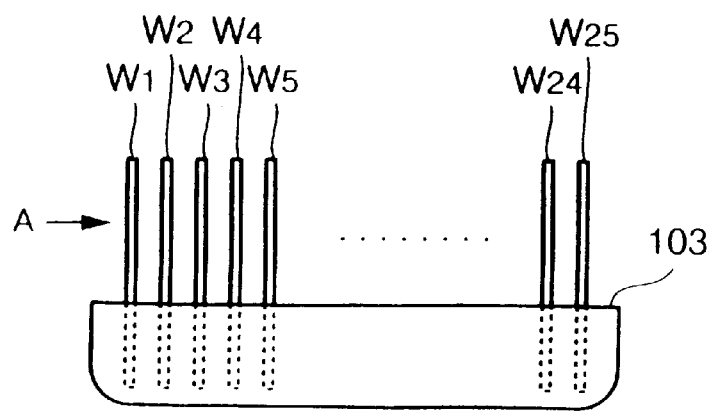
FIG. 27 is a conceptual diagram showing a side view of wafer locations in a boat (fixture for holding a plurality of wafers).

For example, as shown in FIG. 22(*a*), in the case where fail bits 113 are concentrated in a specific corner of a memory cell array region 111, it infers a rotation error of the reticule when the exposure device is adjusted to the position of an initial point 112 on the wafer.

In this case, three word lines 118 and two bit lines 119 are replaced by the redundant memory. In the case of a 128 Mbyte semiconductor memory, the column address is 13 bits and the row address is 14 bits, so that the storage capacity is 67 bits. In the case where this failure pattern is compressed by the Second Prior Art, a storage capacity of 27 bits (address bit number)×about 10 (failure pattern number)=270 bits is required.

As another example, shown in FIG. 22(*b*), in the case where fail bits 113 are concentrated in the external part of a plurality of memory cell blocks 116, it infers a defect due to the depth of focus of the exposure device or pattern proximity effect.

In this case, four word lines 118 and four bit lines 119 are replaced by the redundant memory. In the case of a 128 Mbyte semiconductor memory, the column address is 13 bits, and the row address is 14 bits, so that the storage capacity is 13×4+14×4=108 bits. In the case where this failure pattern is compressed by the Second Prior Art, a storage capacity of 27 bits (address bit number)×about 50 (failure pattern number)=about 1.4 k bits is required.

In this manner, the storage capacity of the fail bitmap can be greatly reduced with the present invention.

Furthermore, since the fail bitmap is stored by replacement address, it can be promptly judged whether the number of defects is within the range where replacement by redundant memory is possible. Moreover, by controlling the change in the number of replacements to replacement addresses, the ratio of replacements to the total replaceable number of the semiconductor memory can be recognized. If the arrangement is such that a warning goes off when the replacement ratio reaches a threshold, a process step that causes failures can be discovered before a large number of defecty semiconductor memories is produced. As a result, it is possible to prevent in advance a situation in that the failure rate of the semiconductor memories manufactured worsens such that the products cannot be supplied, thus enabling a stable supply of semiconductor memories.

Next is a detailed description of each structural element of one embodiment of the present invention with reference to the drawings. FIG. 1 is a block diagram showing a structural example of a semiconductor memory production system according to one embodiment of the present invention.

In this figure, an LSI tester 1 comprises a CPU and a memory section such as memory, a hard disk and the like, and performs a functional test (AC test) and a direct current characteristics test (DC test) of the semiconductor memory as a chip in the wafer state (after the wafer process) according to a test program stored in the memory section.

Here, after the wafer process, refers to the stage when the wafer back grinding process step is completed.

That is to say, the wafer process includes all process steps in the wafer manufacturing process that forms transistors on the wafer surface, such as ion implantation steps (impurity injection steps), diffusion steps, thin film deposition steps, patterning steps, etching steps, back grinding steps and the like.

As follows is a description of a semiconductor memory (hereunder sometimes referred to as a chip) to be analyzed, as memory having a redundant circuit comprising memory cells that can replace failed memories, for example DRAM (dynamic random access memory).

Furthermore, the LSI tester 1, in a test of semiconductor memory in the wafer condition, outputs a bitmap file (defect cell test information) 4 of the address data (hereunder referred to as bitmap data) of defective memory cells (hereunder referred to as fail bits) in a semiconductor memory chip, to the replacement address decision device 2, for a chip as a unit.

The replacement address decision device 2, based on the bitmap data input from the LSI tester 1, analyzes which of the replacements of word lines with word lines from the redundant circuit, and of bit lines with bit lines from the redundant circuit can achieve the saving of fail bits effectively (least number of replacements of redundant bit lines and redundant word lines) for each chip input sequentially. Then, the analysis process for saving the defecty bits as mentioned above is performed for all the chips on the wafer and all the wafers in a lot.

Here, the replaceable memory cells comprise a redundant memory cell region that is connected to the redundant word lines and formed in the word line direction, and a redundant memory cell region that is connected to the redundant bit lines and formed in the bit line direction. Each of these redundant memory cell regions comprises a plurality of redundant word lines and a plurality of redundant bit lines.

That is to say, in the case where three memory cells (hereunder referred to as fail bits) have defects in a plurality of memory cells existing on one word line, if the word line is replaced with a redundant word line, one replacement is sufficient. However, in the case where the bit lines are replaced with redundant bit lines, three lines are required. Therefore, the efficiency of the number of lines used is better when the word line is replaced with the redundant word line. As mentioned above, a failure analyzer 2 performs an analysis of the possible combinations of redundant word lines and redundant bit lines to replace fail bits effectively.

Furthermore, the failure analyzer 2 generates fuse address data which makes the addresses of the redundant bit line and redundant word line to be replaced with the bit line and the word line respectively, which are selected as the result of the above mentioned analysis, the same as the addresses of the corresponding word line and bit line.

That is to say, the redundant word line and redundant bit line, which are described in detail later, are provided with an address setting circuit comprising a plurality of fuses for setting each address. By disconnecting predetermined fuses corresponding to the required address among these fuses, the address can be set arbitrarily. The replacement address decision device 2, based on the data of the address of the word line and bit line to be replaced mentioned above, generates fuse address data that assigns which fuses are to be disconnected to form the address of the word line and bit line to be replaced, and outputs the generated fuse address data to the trimming device 3.

Figure 9:
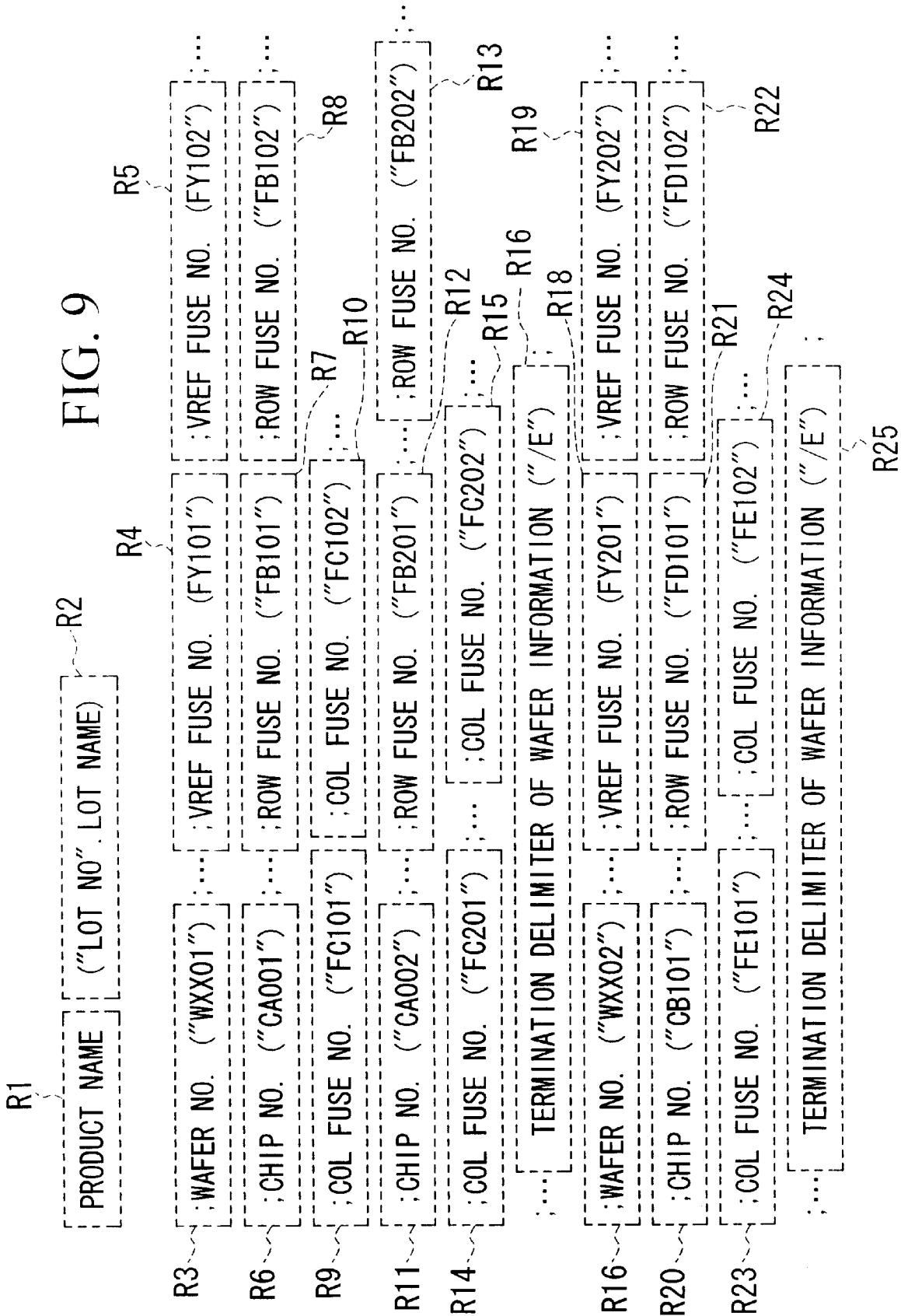
FIG. 9 shows the structural format of fuse addresses showing fuse disconnection locations by a redundant address analysis device 2 of the present invention.

The format of the fuse address data that the replacement address decision device 2 outputs to the trimming device 3 at this time is, for example, of the form shown in FIG. 9.

That is to say, in region R1, text data "PRODUCT NAME" is inserted, and in region R2 "LOT NO", LOT NAME, the identifier LOT NO, and the lot number LOT NAME are inserted as text data In region R3, text data "WXX01" is inserted, where "W" is the wafer identifier and "XX01 " is the wafer number.

Subsequently, in the line of region R4, region R5, . . . , Vref FUSE numbers are inserted as text data "FY101, "FY102", . . . , in the sequence of the chips on the wafer of the wafer number mentioned above.

Here, the fuses designated by Vref FUSE numbers are used in ion implantation process steps to correct discrepancies of reference voltage Vref, such as the internal power supply voltage, due to the variation of threshold VT.

That is to say, by disconnecting the fuse designated by the Vref FUSE number selected by the replacement address decision device 2, corresponding to the threshold VT of a transistor measured by a tester, the reference voltage Vref can be adjusted to a predetermined voltage, for example twice the voltage of the threshold voltage VT.

Furthermore, in region R6, the chip identifier "C" and chip number "A001" are inserted as the text data "(CA001)".

Subsequently, in the line of region R7 and region R8, . . . , a fuse identifier "F" and a Row FUSE No. "B101" that shows the number of a fuse to be disconnected are inserted as text data "FB101, "FB102", . . . , in numerical order (fuse address line of Row FUSE No.). Here, the items of text data are delimited by ";".

Similarly, in the line of region R9 and region R10, . . . , a fuse identifier "F" and a Col FUSE No. "C101" that shows the number of a fuse to be disconnected are inserted as text data "FB101, "FB102", . . . , in numerical order (fuse address line of Col FUSE No.).

Then, in region R11, a chip number indicating the next chip number is inserted as text data "CA002".

Afterwards in the sequence mentioned above, in regions R12 through R15, chip numbers, Row FUSE numbers and Col FUSE numbers are inserted.

Next, in region R16, text data "/E" indicating a termination delimiter of the chip number, Row FUSE number and Col FUSE number of the first wafer is inserted as a termination sign of the wafer information.

Then, in a region R17, text data "WXX02" indicating the next wafer number is inserted.

Afterwards, similarly to the case of the first wafer "WXX01", up to the section of text data "/E", the wafer information termination delimiter shown in region R25, that is to say, from the regions R18 through R24, the Vref FUSE number of the second wafer "WXX02", Row FUSE numbers and Col FUSE numbers corresponding to each chip are inserted.

Similarly afterwards, each FUSE number in the wafers of the lot whose lot number "LOT NO" is inserted in the region R2 is inserted sequentially.

Figure 10:
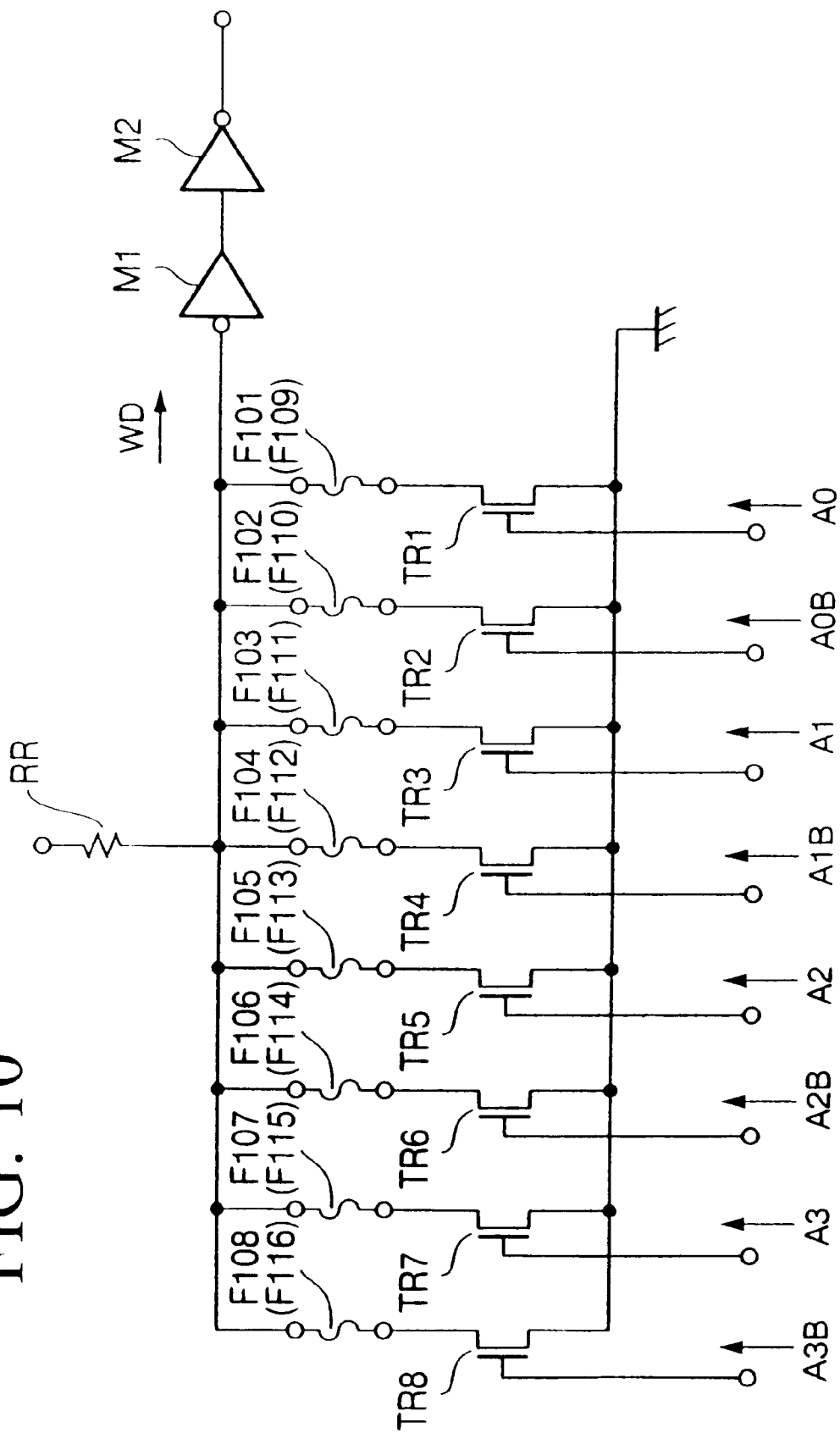
FIG. 10 is a conceptual diagram showing a structural example of a fuse circuit for setting one redundant word line address.

Moreover, the FUSE numbers used in the above description designate the corresponding fuse numbers shown in FIG. 10. FIG. 10 is a conceptual diagram showing a structural example of a fuse circuit for setting the address of one redundant word line. Normally, a plurality of redundant word lines is prepared. For simplicity, an address signal for the word line comprises four lines of address signal A0 through address signal A3. The actual number of these address signals differs depending on the memory capacity and memory configuration. The fuse circuits in the redundant bit lines and Vref adjustment also have the same construction as in FIG. 10.

In this FIG. 10, the Row FUSE numbers in FIG. 9 correspond, for example to fuse F101 through fuse F108.

That is to say, the external address signal input A0 is input to the transistor gates of n channel type MOS (Metal-Oxide film-Semiconductor) transistors corresponding to transistor TR1 through transistor TR8, via a decoder (not shown in the figure), as complementary signals of the same signal, that is the address signal A0, and an inverse signal, that is address signal A0B. For example, the address signal A0 is input to the gate of the transistor TR1, and the address signal A0B is input to the gate of the transistor TR2.

Furthermore, one end of the fuse F101 is connected to the drain of the transistor TR1, and the other end of the fuse F101 is connected to a power supply of a predetermined voltage via a resistor RR. Similarly, one end of each of the fuse F102 through fuse F108 is connected to each of the drains of transistor TR2 through transistor TR8, and the other end of each of the fuse F102 through fuse F108 is connected to the power supply of a predetermined voltage via the resistor RR.

The sources of the transistor TR1 through transistor TR8 are grounded. Furthermore, the node at the other ends of the fuse F101 through the fuse F108 and the resistor RR is connected to the input terminal of an inverter M1. The inverter M1 and an inverter M2 perform level adjustment and waveform shaping of the word signal WD.

For example, in a bitmap in which the wafer number input from the LSI tester 1 is "W0001" and the chip number "A001", in the case where the replacement address decision device 2 decides to replace the word line with an address signal {A3, A2, A1, A0}={0, 0, 1, 1} with a redundant word line, a fuse address is generated from this address signal {0, 0, 1, 1}.

That is to say, in the case where the address signal {0, 0, 1, 1} is input, the replacement address decision device 2 decides the fuses to be disconnected from the fuse F101 through the fuse F108 such that the word signal WD becomes "H" level.

In the case where the address signal {0, 0, 1, 1 } is input, the address lines of the address signal that become "H" level are address lines {A3B, A2B A1, A0}. At this time, since the address lines {A3, A2, A1B, A0B} that complement the address lines "{A3B, A2B, A1, A0}" are at "L" level, the transistor TR2, the transistor TR4, the transistor TR5 and the transistor TR7 are off, so that current does not flow.

Therefore, by disconnecting the fuses connected to the transistors whose gate these address lines {A3B, A2B, A1, A0} are input to, the current path is not closed. Consequently, even when the transistor TR1, the transistor TR4, the transistor TR5 and the transistor TR8 are on, the current does not flow, and hence the word signal WD becomes "H" level.

Accordingly, the replacement address decision device 2 forms a fuse address for replacing the word line corresponding to the address signal {0, 0, 1, 1} with the redundant word line as the fuse numbers of line {F108, F106, F103, F101}.

Furthermore, in the case where the address signal of a word line of another replacement object is an address signal {1, 1, 0, 0}, the replacement address decision device 2 forms a fuse address for replacement by a redundant word line as the fuse numbers of line {F115, F113, F112, F110}.

Similarly, the replacement address decision device 2 determines the fuse numbers of line {FC101, FC102, FC103, FC104} corresponding to the address of the bit line to be replaced by a redundant bit line, to replace the bit line by the redundant bit line, based on the abovementioned bitmap.

Moreover, it is necessary to adjust the voltage level of reference voltage Vref of the internal power supply voltage.

That is to say, to adjust to a predetermined voltage level based on the threshold voltage VT measured for each semiconductor memory chip, which is input from the LSI tester 1, the replacement address decision device 2 determines the line of Vref FUSE numbers to be disconnected, for example, like the line {FY101, FY102, FY103, FY104, . . . } of Chip No. "CA001", for each chip corresponding to the line of Vref FUSE numbers.

Then, the replacement address decision device 2, as mentioned above, outputs the fuse address data shown in FIG. 9 for a given lot, which is created based on the created bitmap file 4 input from the LSI tester to the trimming device 3 shown in FIG. 1, and also stores this fuse address data in the fuse address data file 5.

The trimming device 3, based on the fuse address data input, disconnects the appropriate fuses of each chip by laser.

Furthermore, to output the abovementioned fuse address data, and the lines of fuse numbers, continuously, for example with the line of Row FUSE numbers, as shown in FIG. 9, the replacement address analyzer 42 writes a fuse address line of ". . . ; Row FUSE number (F010); Row FUSE number (F103); Row FUSE number (F106); Row FUSE number (F108); Row FUSE number (F110); Row FUSE number (F112); Row FUSE number (F113); Row FUSE number (F115); . . . "

Moreover, in the abovementioned fuse address line for example, the replacement address analyzer 42 generates a tabular file as shown in FIG. 11 in which the first fuse number, being the fuse number when the line starts, indicates the delimitation between the line of Row FUSE numbers and Col FUSE numbers, and corresponds to the word lines to be replaced by redundant word lines, described as a sequence of redundant word lines to be used, and stores this table format file in the storage device 6 (refer to FIG. 1).

At this time, the format of the Col FUSE numbers starts with F501, and the address number is of the same format as the Row FUSE number.

Then, fuse number F101 through fuse number F108 are designated as a group GR1, fuse number F109 through fuse number F110 as a group GR2, . . . , fuse number F501 through fuse number F508 as a group GL1, and fuse number F509 through fuse number F510 as a group GL2, . . . .

Here, F501, F502, F503, F504, . . . corresponds to FY101, FY102, FY103, FY104, . . . .

Accordingly, in FIG. 11, text data Row Fuse First No. "F101", GR1, which indicates that the first fuse number of the group GR1 is fuse F101, is inserted in region R51, and text data Row Fuse First No. "F109", GR2, which indicates that the first fuse number of the group GR2 is fuse F109, is inserted in region R52.

Similarly afterwards, the first numbers of the fuses comprising each group, which correspond to the fuses for replacing the redundant word lines are inserted.

Furthermore, in FIG. 11 text data Col Fuse First No. "F509", GL2, which indicates that the first fuse number of the group GL1 is fuse F501, is inserted in region R61, and text data Col Fuse First No. "F509", GL2, which indicates that the first fuse number of the group GL2 is fuse F509, is inserted in region R62.

Similarly afterwards, the first numbers of the fuses comprising each group, which correspond to the fuses for replacing the redundant word lines are inserted.

Then the replacement address analyzer 42 divides the Row Fuse number fuse address lines and Col Fuse number fuse address lines into groups of fuse addresses, comprising Row Fuse numbers to be disconnected and Col Fuse numbers to be disconnected respectively, by using the first fuse numbers inserted in the table tabular file in FIG. 11.

Furthermore, the replacement address analyzer 42 processes the fuse file shown in FIG. 9 and generates the intermediate file shown in FIG. 12. As shown in FIG. 12, this intermediate file is a file in which the fuse file text data delimited by ";" in FIG. 9 is converted so as to be described in one line. Here, for the Row Fuse numbers and Col Fuse numbers, fuse F101 through fuse F108 and fuse F501 through fuse F508 as mentioned above are used.

Moreover, the replacement address analyzer 42 generates redundant addresses from the abovementioned intermediate file.

Here, the redundant addresses mean addresses of word lines and bit lines replaced by redundant word lines and redundant bit lines.

Based on the table format shown in FIG. 11, the replacement address analyzer 42 divides the fuse address lines in the intermediate file shown in FIG. 12 into groups of fuse addresses comprising Row Fuse numbers to be disconnected or Col Fuse numbers to be disconnected.

For example, the replacement address analyzer 42 divides the fuse addresses comprising Row Fuse numbers to be disconnected into group GR1{F108, F108, F104, F101}, group GR2 {F115, F113, F112, F110}, . . . .

Then, the replacement address analyzer 42 performs a process to convert the divided fuse address groups into redundant addresses.

For example, the replacement address analyzer 42 converts the elements of Row Fuse number group GR1 {F108, F105, F104, F101} of group GR1 to "1" in the case where the fuse number is odd, and "0" in the case where the fuse number is even.

Similarly, the replacement address analyzer 42 converts the divided fuse addresses of the other groups into data of "0" or "1".

Then, the replacement address analyzer 42 converts the converted group GR1 {0,1,0,1} and group GR2 {1, 1, 0, 0}, . . . into hexadecimal format, and forms redundant addresses as group GR1{3} and group GR2 {A} respectively.

Similarly, the replacement address analyzer 42 converts the converted group GL1 {1,1,0,0} and group GL2 {0, 0, 0, 1}, . . . into hexadecimal format, and forms redundant addresses as group GL1{A} and group GL2 {1} respectively.

Then, the replacement address analyzer 42 for example for each wafer in the lot, stores in the storage device 6, the data of; chip number, the addresses of replaced word lines and bit lines, the number of replaced word lines and bit lines, and the distribution condition of chips in each wafer, for each chip of format shown in FIG. 13.

Here is a description of the format of the analysis data file shown in FIG. 13. In region R100, text data Lot No. "CB-10" is inserted, which indicates that the lot number of this lot is Lot No. "CB-10".

In region R101, text data Wafer No. "W01", indicating the wafer number, is inserted, which indicates that the wafer number of the lot of Lot No. "CB-10" mentioned above is Wafer No. "W01".

Furthermore, in region R102, text data Chip No. "C5, 20", indicating the chip number, is inserted, which indicates that the chip number of the Wafer No. "W01" mentioned above is Chip No. "C5, 20".

In region R103, text data of Vref addresses {"FY101", "FY103", . . . }, indicating the Vref addresses based on the Vref FUSE numbers, is inserted, which indicates that the Vref addresses of the Chip No. "C5, 20" are Vref Addresses {"FY101", "FY103", . . . }.

Furthermore, in region R104, the number of Vref addresses, that is to say data indicating how many fuses are disconnected, for example text data ("3"), is inserted, wherein three fuses are disconnected.

In region R105, text data Word Line Address No. {"21, "1A", "3A", . . . } is inserted, which indicates that the address number of the word line that is replaced by a redundant word line in the Chip No. "C5, 20" is "21, 1A, 3A, . . . ".

In region R106, text data No. Addresses "4" is inserted, which indicates that the replacement number of word lines replaced by redundant word lines is "4".

In region R107, text data Bit Line Address No. {"5A, "CB", "D2", . . . } is inserted, which indicates that the address number of the bit line in Chip No. "C5, 20" that is replaced by a redundant bit line is {5A, CB, D2, . . . }.

In region R108, text data No. Addresses "10" is inserted, which indicates that the replacement number of bit lines replaced by redundant bit lines is "10".

In region R109, text data Chip No. "C5, 21", indicating the chip number, is inserted, which indicates that the chip number in the abovementioned Wafer No. "W01" is Chip No. "C5, 21". Similarly afterwards as mentioned above, the Vref addresses, number of Vref addresses, word address numbers, number of word line addresses, bit line address numbers, and the number of bit line addresses of Chip No. "C5, 21" are inserted as text data.

Then, when all of the chip number text data of all the semiconductor memory chips on the wafer Wafer No. "W01", the Vref addresses, the number of Vref addresses, the word line address numbers, the number of word line addresses, the bit line address numbers and the number of bit line addresses is completed, in region R110 text data "Total No. Replacements "243"" indicating that the total replacement number, where the sum of the number of word line addresses and bit line addresses of each chip is calculated for all chips in the wafer, is "243".

At this time, the defect distribution analyzer 32 computes the total number of word line addresses and bit line addresses of each chip, and then calculates the total wherein the summation is performed for all of the chips on the wafer.

After the text data of the chip numbers of the semiconductor memory chips in the wafer of Wafer No. "W01, Vref addresses, the number of Vref addresses, the word line address numbers, the number of word line addresses, bit line address numbers, the number of bit line addresses is described with regards to all of the chips and the text data of the total replacement number is inserted, the identifier "/E", indicating that the wafer data of Wafer No. "W01" is completed, is inserted in region R111.

Next, in region R112, similarly to the description of region R101, text data indicating the wafer number of Wafer No. "W02" is inserted, which indicates that the wafer number in the lot of the abovementioned Lot No. "CB-10" is Wafer No. "W02".

Furthermore, in region R113, similarly to the description of region R102, text data indicating the chip number Chip No. "C5, 20" is inserted, which indicates that the chip number of the abovementioned Wafer No. "W02" is Chip Number "C5, 20".

Similarly afterwards, text data of each chip number of the semiconductor chips on Wafer No. "W02", the Vref addresses, the number of Vref addresses, the word line address numbers, the number of word line addresses, the bit line address numbers, and the number of bit line addresses are inserted with regard to all of the chips, and in region R113, text data, "Total No. Replacements "5–21", indicating the total replacement number is inserted.

Furthermore, in region R114, text data "E/" indicating that the wafer data of Wafer No. "W02" is completed is inserted.

When the data of all of the wafers in the lot Lot No. "CB-10" are completed, in region R115, "EOF" is inserted as an identifier indicating the end of the analysis data file of the lot of Lot No. "CB-10".

Each item of text data in the analysis data file shown in the abovementioned FIG. 13 is delimited by ";".

Moreover, the defect distribution analyzer 32 reads out the data analysis file stored in the storage device 6 chronologically, and outputs it to the display device 33 (for example CRT or printer). For example, the defect distribution analyzer 32 activates an analysis program stored in the storage device 6 and, based on an analysis of the input data file, displays the total replacement numbers used in each lot with a kinked line A as shown in FIG. 14, chronologically in the sequence of lot processing.

Figure 14:
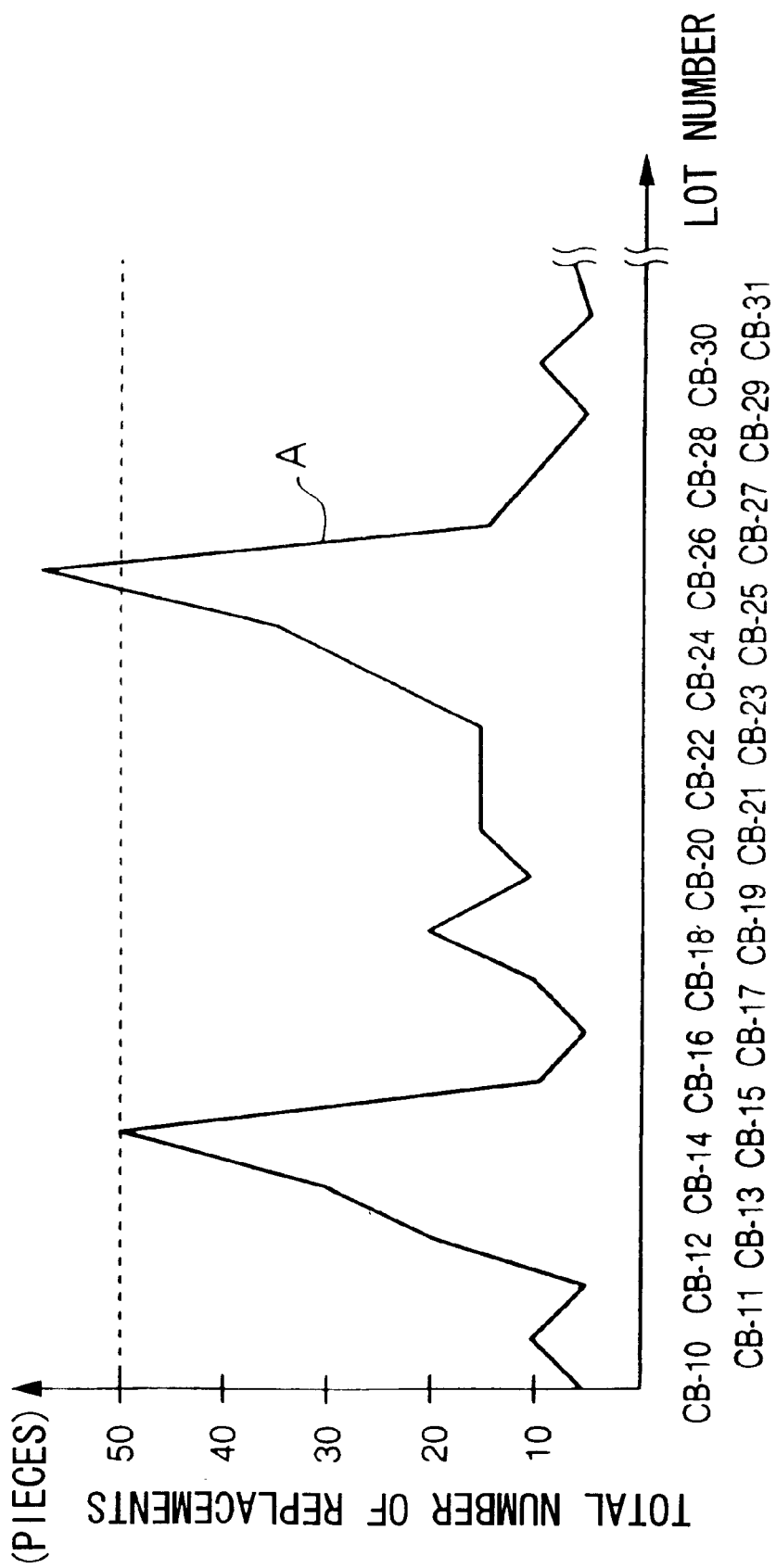
FIG. 14 is a line graph wherein the horizontal axis shows lot numbers processed in chronological order, and the vertical axis shows the total number of replacements in each lot.

That is to say, in the graph shown in FIG. 14, the horizontal axis shows lot number, where new numbers are placed sequentially from left to right, and the vertical axis shows the total number of replacements in each lot.

With the process defect estimation device 34, the total replacement number is set such that when the total number of replacements reaches fifty for example, failure analysis is performed.

At this time, since the total number of replacements in Lot No. "CB-15" and Lot No. "CB-26" is greater than or equal to 50, the process defect estimation device 34 displays them with a different point color from the other lots, which indicates to the operator that it exceeds the set value. Here, in the case where the total number of replacements is less than 50, the points are displayed in "blue", and in the case where the total number of replacements is greater than or equal to 50, the points are displayed in "red". This means that the process defect estimation device 34 indicates to the operator that it is now necessary to perform analysis to find the process defect.

Furthermore in FIG. 14, with the lot number on the horizontal axis and the vertical axis showing the number of word lines replaced by redundant word lines and the number of bit lines replaced by redundant bit lines, the set number to perform failure analysis is displayed as a kinked line set at a number of, for example, 70% (this number is determined based on the types and the like of redundant word lines and redundant bit lines) of the number of redundant word lines and redundant bit lines in the memory cell region that are capable of being changed.

In this manner, in the case where either the number of word lines replaced by redundant word lines or the number of bit lines replaced by redundant bit lines exceeds the preset number, the process defect estimation device 34 displays the points of the line at the corresponding lot numbers exceeding the preset number with a "red" color instead of a "blue" color, and indicates to the operator that it is now necessary to perform analysis to find the process defect.

When the operator is alerted that it is now necessary to perform analysis to find the process defect as mentioned above, he starts a failure analysis program stored in the storage device 6 in the process defect estimation device 34. The process defect estimation device 34 then operates according to the failure analysis program that is started.

From the data analysis file stored in the storage device 6, the process defect estimation device 34 displays on the display device 33, as shown in FIG. 15, a bar graph of the relationship between the word line addresses in each chip of the wafers in a lot and the number of replacements of word lines with redundant word lines, and the relationship between the bit line addresses in each chip of the wafers in the lot and the number of replacements of bit lines with redundant bit lines.

Figure 15B:
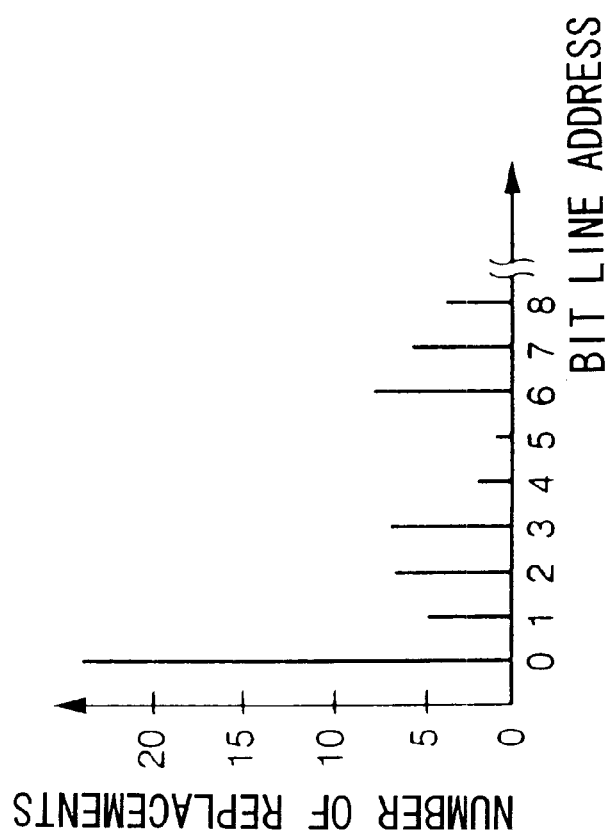
FIGS. 15A and 15B are bar graphs showing the relationship between the word line addresses for each chip on the wafers in a lot and the number of replacements of these word lines with redundant word lines, and the relationship between the bit line addresses for each chip on the wafers in a lot and the number of replacements of these bit lines with redundant bit lines.
Figure 15A:
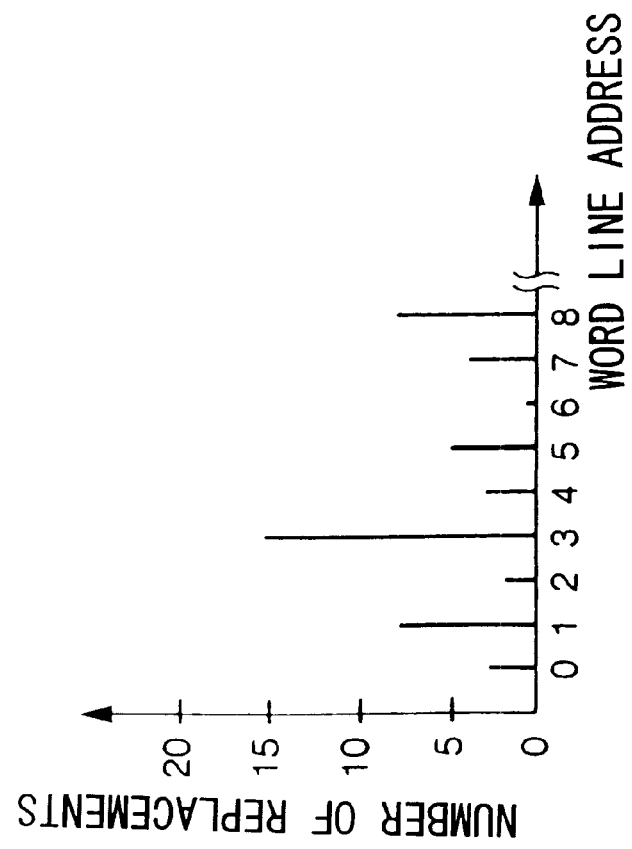

That is to say, FIG. 15(a) shows the relationship between the word line addresses of each memory cell in a chip on the horizontal axis, and the number of replacements of word lines with redundant word lines in the whole lot on the vertical axis.

Similarly, FIG. 15(b) shows the relationship between the bit line addresses of each memory cell in a chip on the horizontal axis, and the number of replacements of bit lines with redundant bit lines in the whole lot on the vertical axis.

With this FIG. 15 it can be determined which addresses have especially large numbers of replacements for each bit line or word line (analysis pattern of the number of replacements corresponding to addresses).

For example as shown in FIG. 15(a), if the bit line with an address "0" has a large number of replacements with redundant bit lines, it is estimated that the process corresponding to this defect distribution is the cause of the failure.

The cause of the failure of the bit lines with this address has been stored in a defect distribution data base 3 in advance as a defect distribution pattern (the pattern of a graph of the form shown in FIG. 15), and a corresponding graph (corresponding table) of process defects corresponding to this defect distribution pattern. Based on the corresponding table of this defect distribution data base 35, the process defect estimation device 34 displays the process defect with a failure pattern most closely resembling this defect distribution pattern on the display device 33 as estimated failure data.

At this time, the process defect estimation device 34 judges that the abovementioned defect distribution pattern is close to the failure pattern caused by a process defect in the resist exposure by a stepper, wherein the light diffraction is less with some patterns than others and the width of the pattern becomes wider, estimating that one of the exposure processes of this stepper is the cause of the bit line failure, and displays this estimated result on the display device 33. In general, a semiconductor chip comprises blocks of memory cells in each of which are formed memory cells and a peripheral circuit that controls the exchange of memory information with the outside. The memory cell blocks may be further subdivided into a plurality of blocks.

Furthermore, there is a difference between the pattern density of the block of memory cells and the peripheral circuit formed on the mask or reticule. Therefore the size of the memory cells located at the periphery of the block is different from the memory cells in the center of the block due to the influence of light diffraction. Moreover, there is a case where the height of the memory block is different from the peripheral circuit. In the case where a flexible insulating film such as SOG (spin on glass) is formed on the top, there could be a difference in the film thickness between the periphery and the central part of the block. For such reasons, fail bits can easily be concentrated at a specific address, and the corresponding replacement address distribution becomes a pattern of a specific failure cause.

The operator examines the exposure process based on the estimated result displayed on the display device 33 and removes the factor causing the failure to occur.

Furthermore, from the abovementioned replacement address information file 31, the defect distribution analyzer 32 calculates the sum total of the number of addresses of replacements of word lines and the number of addresses of replacements of bit lines, wherein the total is calculated for the chips in corresponding chip locations on each wafer for all the wafers in the selected lot.

Moreover, at this time the defect distribution analyzer 32 does the calculation for corresponding chip locations on each wafer on a wafer image screen 200.

Figure 16:
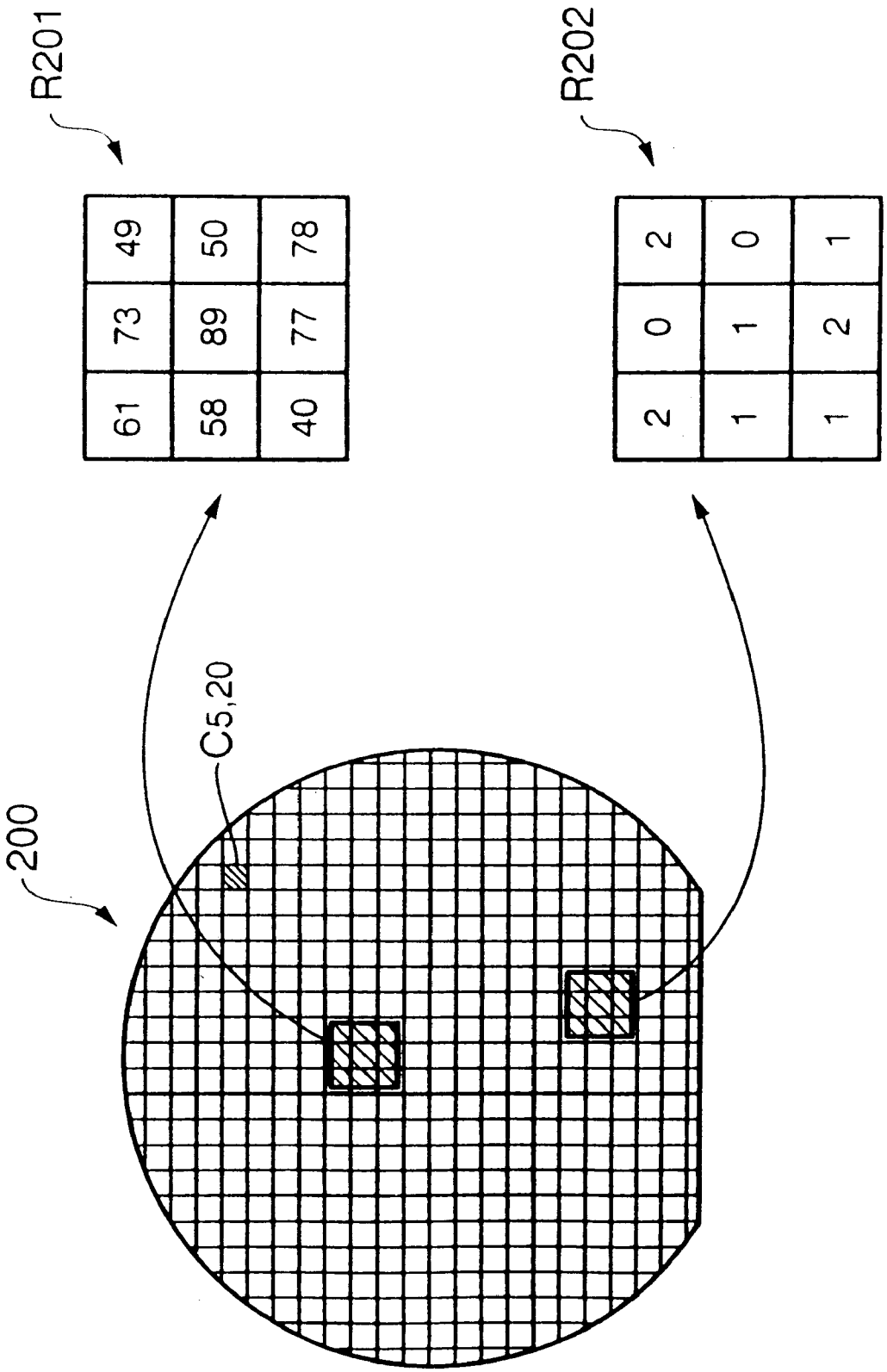
FIG. 16 is a plan view, wherein the sums of the number of addresses of word line replacements and the number of addresses of bit line replacements are calculated for the chips in corresponding chip locations on each wafer for all the wafers, and the sum totals are displayed at the corresponding chip locations on the wafer.

Then, the defect distribution analyzer 32 displays a plan view figure (analysis pattern showing the distribution of the abovementioned sum total value of the wafers) as shown in FIG. 16 on the display device 33.

For example, in FIG. 16 an enlarged view of the central part of the image screen 200 is shown by region R201, and an enlarged view of the lower part is shown by region R202. As in these enlarged views, the abovementioned total value is displayed corresponding to chip 1. In region R201, a chip display frame shows 9 chip locations, within which text data "61", "73", "49", "58", "89", "50", "40", "77" and "78" are displayed in the chip display frame. In this figure, the chip location of Chip No. "C5, 20" is shown.

That is to say, FIG. 16 is a distribution diagram wherein all of the wafers in one lot are overlaid onto one image, and the total value for where the sum totals of the number of addresses of replacements of word lines and the number of addresses of replacements of bit lines of all chips at each location on the overlay are added, is shown at the corresponding chip locations, from which it can be judged which region on the wafer has chips where the abovementioned total value is unusually large.

Here, the abovementioned total value is computed by the failure analyzer 2 using the number of addresses of replacements of word lines and the number of addresses of replacements of bit lines of each chip extracted from the analysis file.

At this time, the defect distribution analyzer 32 does not display a numerical value at the chip location, but by altering the display color of each chip location on the wafer with gradations for each value in predetermined numerical ranges, and changing the display color of the chip location (for example blue when the total number of replacements is 0 to 10, yellow when 11 to 20, red when greater than or equal to 21, etc.), the analysis pattern is classified for each value in predetermined numerical ranges, so that it becomes clear and hence simplifies the process of comparison with failure patterns (defect distribution patterns of a similar shape to the analysis pattern wherein the abovementioned total value is classified for each value in predetermined numerical ranges) that are stored in the defect distribution data base (data base: DB) 35 in advance.

Based on the corresponding table of failure patterns stored in the defect distribution data base 35 and their process defects, the process defect estimation device 34 detects the process defect with a failure pattern most closely resembling the analysis pattern shown in FIG. 16, and extracts from the corresponding table the process defect corresponding to the failure pattern that has been detected as approximating to the above analysis pattern and displays it on the display device 33 as estimated data.

Furthermore, as shown in FIG. 17, the process defect estimation device 34 displays a plan view figure from the replacement information address file 31 wherein, similar to FIG. 16, the sum of the number of addresses of replacements of word lines and the number of addresses of replacements of bit lines for each chip location on the wafers is calculated for all even number wafers and all odd number wafers in the lot, the sum totals of corresponding chip locations for all even number wafers and odd number wafers are calculated, and the obtained sum total is inserted on each chip location on the wafer displayed on the display device 33.

Figure 17C:
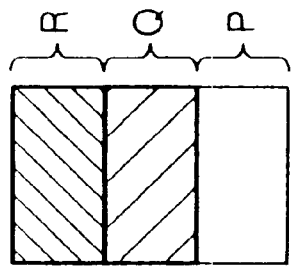
FIGS. 17A to 17C are plan views wherein the sums of the number of addresses of word line replacements and the number of addresses of bit line replacements are calculated for each chip location on the wafers for even number wafers and odd number wafers, and the sum totals are displayed at the corresponding chip locations on the wafers for all even number wafers and all odd number wafers respectively.
Figure 17B:
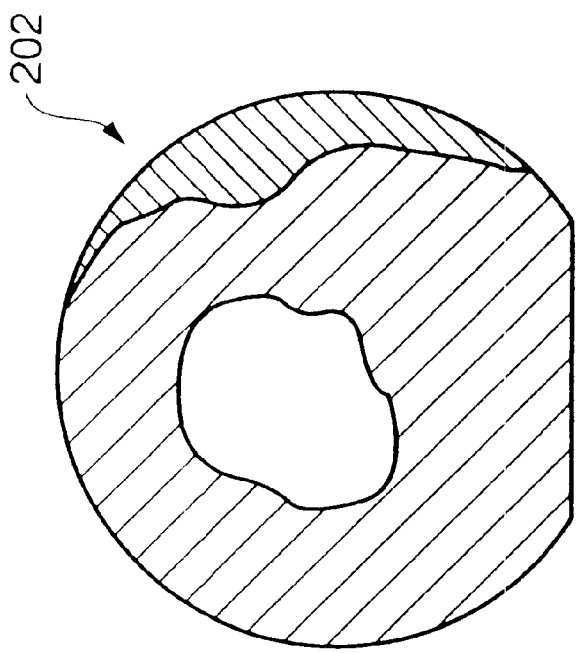
Figure 17A:
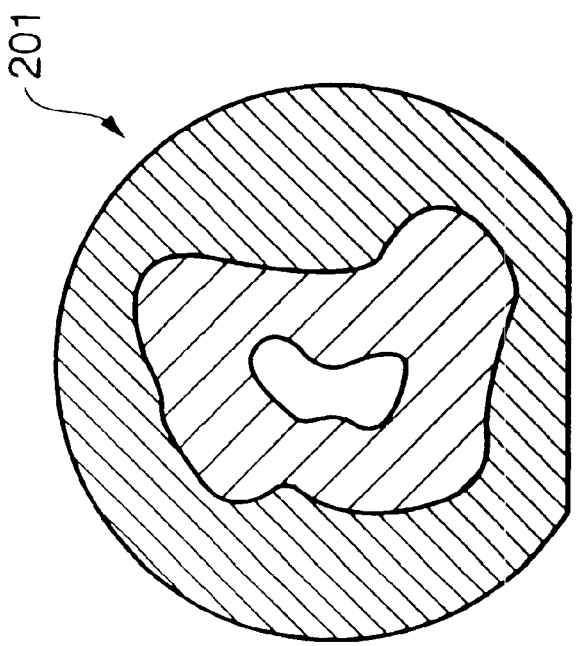

That is to say, FIG. 17 shows a distribution pattern of the number of replacements, wherein the sum total of the number of chip replacements for each chip location for all of the wafers in the lot shown in FIG. 16 is separated for all even number wafers and odd number wafers in the lot for display. In FIG. 17, FIG. 17(a) shows a wafer distribution pattern displayed on an image screen 201 on the display device 33 of the sum total value of the number of replacements on the even number wafers, and FIG. 17(b) shows a wafer distribution pattern displayed on an image screen 202 on the display device 33 of the sum total value of the number of replacements on the odd number wafers.

Then, FIG. 17(c) shows the numerical categories for the patterns in FIG. 17(a) and FIG. 17(b). Here, for example, FIG. 17(c) shows that in the image screen 201 in FIG. 17(a) and the image screen 202 in FIG. 17(b), areas where the sum total value of the number of replacements per chip in each chip location is in the range of 0 to 10 is colored blue as shown in region P, in the range of 11 to 20 is colored yellow as shown in region Q, and in the range of greater than or equal to 21 is colored red as shown in region R.

Furthermore, similar to FIG. 17, in FIG. 16 the distribution pattern is generated in preset ranges of the sum total value of the number of replacements in the same colors as in FIG. 17(c).

Moreover, in FIG. 16 and FIG. 17 each chip frame of the wafer on the image screen displayed by an output device 5 may have only a color inside, corresponding to the color of the sum total value. However, the sum total value may also be displayed on top of the color.

Furthermore, the process defect estimation device 34 based on the corresponding table of failure patterns stored in the defect distribution data base 35 and their process defects, detects the process defect corresponding to the failure pattern by approximating to the analysis pattern shown in FIG. 17, and extracts from the corresponding table the process defect corresponding to the failure pattern that has been detected as approximating to the above analysis pattern, for display on the display device 33 as estimated data. At this time, the process defect estimation device 34 compares the two distribution patterns of the even number wafers on the image screen 201 and the odd number wafers on the image screen 202 shown in FIG. 17(a) and FIG. 17(b) with the failure pattern stored in the defect distribution data base 35 at the same time. When there is a difference in the patterns, the process defect estimation device 34 then infers that there is a failure in one of the two pieces of single wafer processing plasma equipment.

Figure 18:
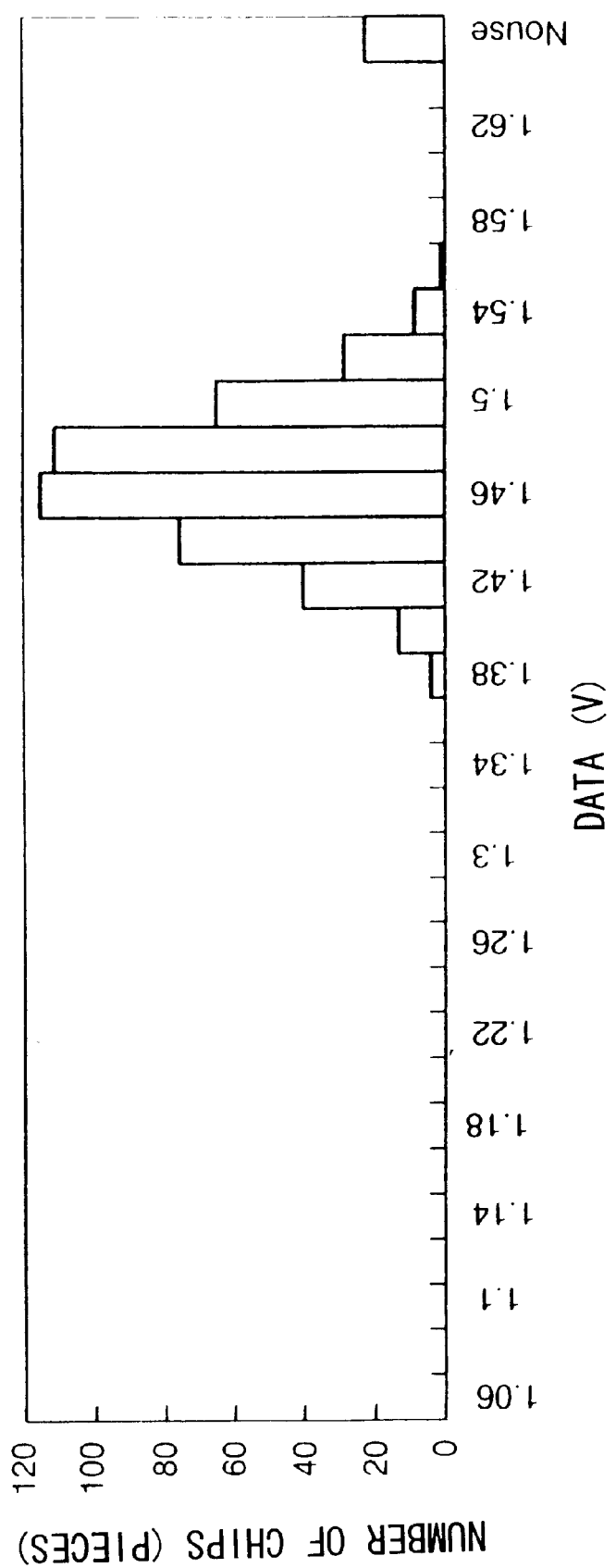
FIG. 18 is a bar graph showing the distribution tendency of the reference voltage Vref voltage before correction for all the chips in a lot.

Moreover, as shown in FIG. 18, based on the Vref FUSE number corresponding to the disconnected fuses of chips on the wafer in the fuse address data file 5, the defect distribution analyzer 32 obtains the voltage value of the reference voltage Vref before correction and displays this voltage value of the reference voltage Vref before correction for all of the chips in the lot in the form of a bar graph. In FIG. 18, the horizontal axis represents the reference voltage Vref and the vertical axis represents the number of chips in which the LSI tester 1 measured the corresponding reference voltage.

Here, the text "No use" at the right end of the horizontal axis showing the reference voltage value in the bar graph in FIG. 18 means unused chips.

In this manner, based on analysis of the reference voltage Vref pattern in the bar graph shown in FIG. 18, the process defect estimation device 34 analyses the difference in transistor threshold VT, and displays the process steps (ion implantation steps, gate oxide film formation steps and the like) related to differences in the threshold VT as the estimated result on the display device 33.

Furthermore, the defect distribution analyzer 32 displays on the display device 33 a plan view (analysis pattern) figure shown in FIG. 19, wherein from the data indicating the disconnection of fuses for the self refresh timer stored in the wafer test information file 23, which is not shown in FIG. 13, sum values of the self refresh timer cycle time of corresponding chip locations on the wafer for all of the wafers are displayed on each corresponding chip location on the wafer.

That is to say, FIG. 19(a) is a distribution figure in which all of the wafers are overlaid, wherein the self refresh timer cycle times of the chips at each chip location are summed and displayed in the corresponding chip locations on the wafer image screen 203 displayed on the display device 33, and from which it can be judged which regions on the wafer have chips with unusually low sum values mentioned above (analysis pattern showing the distribution of the abovementioned sum values on the wafer).

The sum value displayed in the chip frame of each chip location on the image screen 203 mentioned above is a numerical value of the count of all the chips on all the wafers in the lot that are, for example, at the wafer location Chip No. "C5, 20" in FIG. 13 and FIG. 16, and which are judged as having short self refresh timer cycle times.

Here, the abovementioned count is calculated by the replacement address decision device 2 based on correction information of the self refresh timer cycle time for each wafer, which is extracted from the wafer test information file 23.

At this time, the defect distribution analyzer 32 does not display the numerical value at the chip location, but by altering the display color of each chip location on the wafer in gradations for each value in predetermined numerical ranges, and changing the display color of the chip location, the analysis pattern is classified for each value in predetermined numerical ranges, so that it becomes clear and hence simplifies the process of comparison with failure patterns (defect distribution patterns of a similar shape to the analysis pattern wherein the abovementioned count is classified for each value in predetermined numerical ranges), which are stored in the defect distribution data base 35 in advance.

In FIG. 19 for example, where the count of chips at each chip location that need adjustment of the self refresh timer for self refresh is 0 to 2, the distribution pattern (analysis pattern) on the image screen 203 in FIG. 19(a) is colored blue as shown in region H of FIG. 19(b), where 3 to 5 is colored yellow as shown in region I, where 6 to 8 is colored red as shown in region J, and where greater than or equal to 9 is colored black as shown in region K.

Here, the self refresh timer cycle time must be shorter than the data holding time of the memory cell. The data holding time means the period that a capacitor that stores electric charge can hold sufficient electric charge as data that can be judged 0/1 by a sense amplifier. Furthermore, if the shortest data holding time of all the memory in one chip is the hold time, the refresh timer cycle time needs to be shorter than the hold time.

Therefore, in the case where the distribution of chips in the wafer that need correction of the self refresh timer cycle time is large, the process defect estimation device 34 infers that the process step for forming the abovementioned capacitor has a process defect, and displays the result on the display device 33.

Furthermore, in each image screen in FIG. 17 and FIG. 19, the lines of the chip frames showing chip locations are omitted for easy understanding of the analysis pattern drawing, with the purpose of explaining the color distinction of each value in predetermined numerical ranges and the variation of color gradations. Moreover, based on the fuse file, the trimming device 3 disconnects the fuses of semiconductor memory chips for each wafer, and replaces the word lines and bit lines with redundant word lines and redundant bit lines.

Each wafer is retested by the wafer tester 22 after the abovementioned word lines and bit lines have been replaced with redundant word lines and redundant bit lines.

At this time failing chips are scrapped. On the other hand, PASS (judged to be non-defective products) chips are cut/separated by a saw on a package assembly device 26, assembled into a chip unit and packaged by plastic resin and the like in a chip unit. After that, retest is performed and the products judged non-defective are shipped.

Furthermore, the defect distribution data base 35 stores in the form of the corresponding table, the failure patterns which are in a form (pattern form) similar to the analysis patterns shown by graphs and figures in FIG. 15, FIG. 16, FIG. 17 and FIG. 19, corresponding to the process steps of the process defects depending on each defect pattern.

As described above, since the analysis data in which the addresses of bit lines and word lines replaced by redundant circuits are entered is stored chronologically as data in the redundant address information file 31, a large memory capacity as needed for the storage of conventional lot unit bitmap data is not necessary with the present invention, and hence it is possible to store information of each chip on all the wafers in a lot over a long period of time chronologically.

Moreover, with the present invention, since the replacement address information can be stored over a long period of time, when process analysis of an object lot is performed, various types of test for each of the chips judged FAIL do not need to be performed by the LSI tester 1 again, thus enabling the reduction of the number of analysis steps. Furthermore, conventionally there is a problem in that when a fuse is once disconnected, the condition before disconnection cannot be tested. However, in the case of the present invention, since the test condition before disconnection is stored, retest is not necessary.

As mentioned above, with the present invention, since the data capacity for the chips of each lot can be reduced, it is possible to store lot information over a long period of time chronologically. For example, in the case of a 128 Mbyte memory, the memory capacity is about 5 Mbytes for one lot (25 wafers, 200 chips on one wafer), so that the data of 200 lots can be stored on a 1 Gbyte hard disk.

Figure 20:
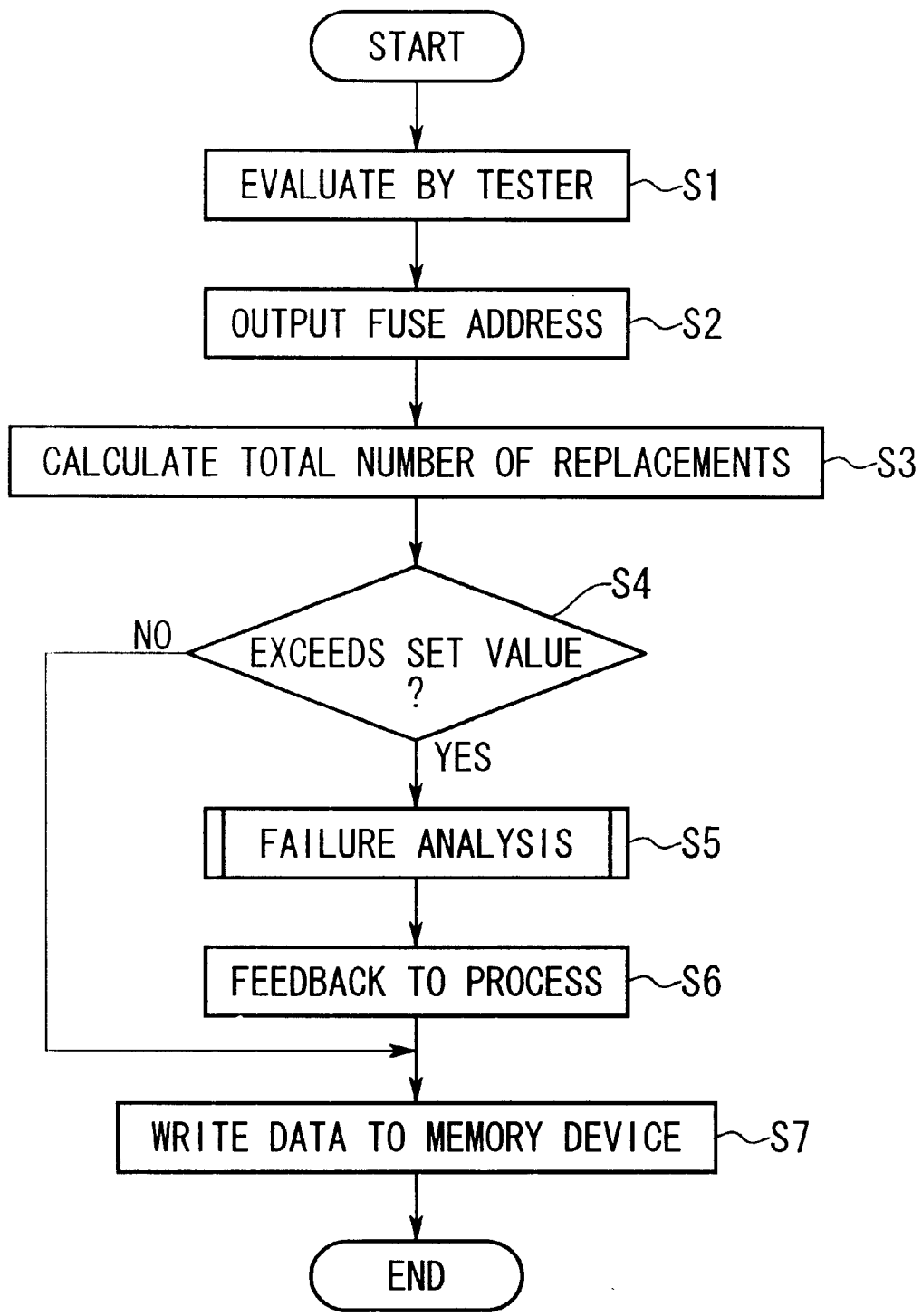
FIG. 20 is a flow chart for explaining a semiconductor memory manufacturing method of the present invention.

Next is a description of an operational example of an embodiment with reference to FIG. 1, FIG. 13, and FIG. 20. FIG. 20 is a flow chart for explaining a semiconductor memory manufacturing method of the present invention. Here, the semiconductor memory used for the description is a memory having redundant circuits, for example, DRAM.

Hereunder is a description followed by the processing sequence of the flow chart in FIG. 20.

After wafer processes such as ion implantation steps (impurity injection steps), diffusion steps, thin film deposition steps, patterning steps, etching steps, back grinding steps and the like are completed, in step S1 a simple test of electrical characteristics and functional characteristics to check just the operation of each of a plurality of chips formed on a wafer is performed for each wafer of a lot by the LSI tester 1.

Then, the LSI tester 1 outputs bitmap data that shows the addresses of fail bits (memory cells) in the memory's memory cell array, to the replacement address decision device 2 for each chip.

Then, in step S2, based on the bitmap data input for each wafer, the replacement address decision device 2 analyses the combination of word lines and bit lines to save the fail bits of each chip on the wafer effectively, and writes fuse addresses for assigning the locations of fuses to be disconnected into the fuse address data file 5 shown in FIG. 9.

Furthermore similarly, based on the voltage value of the reference voltage Vref, the replacement address decision device 2 selects a Vref FUSE number to be disconnected for each chip on each wafer, and writes it into the fuse address data file 5.

Furthermore, the replacement address decision device 2 judges whether correction of the self refresh timer cycle time is necessary from the test result of the LSI tester 1, and writes information of which fuses are to be disconnected to correct the self refresh timer cycle time for chips that require the correction of the self refresh timer cycle time, into the fuse address data file 5. Similarly for these, the fuse addresses are output to the trimming device 3, and the fuses for each of the chips are disconnected.

Next in step S3, from the fuse address data file 5, the replacement address analyzer 42 creates the intermediate file in FIG. 12 based on the table format file in FIG. 11.

Furthermore, the replacement address analyzer 42 stores the addresses of the replaced word lines and bit lines in the replacement address information file 31 sequentially for each chip/each wafer based on this intermediate file.

When the replacement address information file 31 (created for each lot) is created for a new lot, the defect distribution analyzer 32 forms the total number of replacements from this address information file 31.

Then in step S4, the defect distribution analyzer 32 judges whether the total number of replacements is greater than or equal to "50", being a numerical value preset in the storage device.

At this time, if the total number of replacements in a lot of Lot No. "CB-14" is "30", the defect distribution analyzer 32 determines that failure analysis is not required, and control proceeds to step S7.

Next, in step S7, the defect distribution analyzer 32 writes a "blue" point indicating that the total number of replacements is not greater than the limit for performing failure analysis, into the location of Lot No. "CB-14" corresponding to the line graph shown in FIG. 14, and completes the processing of the lot of this Lot No. "CB-14".

On the other hand in step S4, if the total number of replacements of the lot processed subsequently of Lot No. "CB-15", is "51" for example, the defect distribution analyzer 32 determines that failure analysis is required, and control proceeds to step S5.

In this manner, the defect distribution analyzer 32 judges the total number of replacements chronologically and sequentially, and hence it is possible to detect the occurrence of process defects in real time.

Furthermore, since the long-term history of the total number of replacements in each lot is stored as analysis data in the replacement address information file 31, if the variation in the total number of replacements for the process and the occurrence of process defects exhibits a cyclical trend, maintenance of the corresponding process can be performed before the total number of replacements increases greatly by occurrence of actual process defects.

At this time, the process defect estimation device 34 can detect the necessity of the abovementioned maintenance by performing the same process as the failure analysis for estimating process defects.

Then, in step S5, the process defect estimation device 34 performs failure analysis on the lot of Lot No. "CB-15", which has been identified as requiring failure analysis.

In this step S5, based on the lot number, wafer number, chip number, replaced word lines and bit lines for each chip, Vref FUSE number, fuse disconnection information of whether to correct the self refresh timer cycle time or not, and the like in the redundant address information file 31, the defect distribution analyzer 32 creates a distribution of the locations where defects exist. For example, statistical process analysis using the analysis patterns shown in the graphs and figures in FIG. 15, FIG. 16, FIG. 17 and FIG. 19 is performed. Based on the result, the process defect estimation device 34 judges the degree of correlation between each analysis pattern and failure pattern, and successively infers the steps in which process defects corresponding to each analysis pattern occur.

Figure 21:
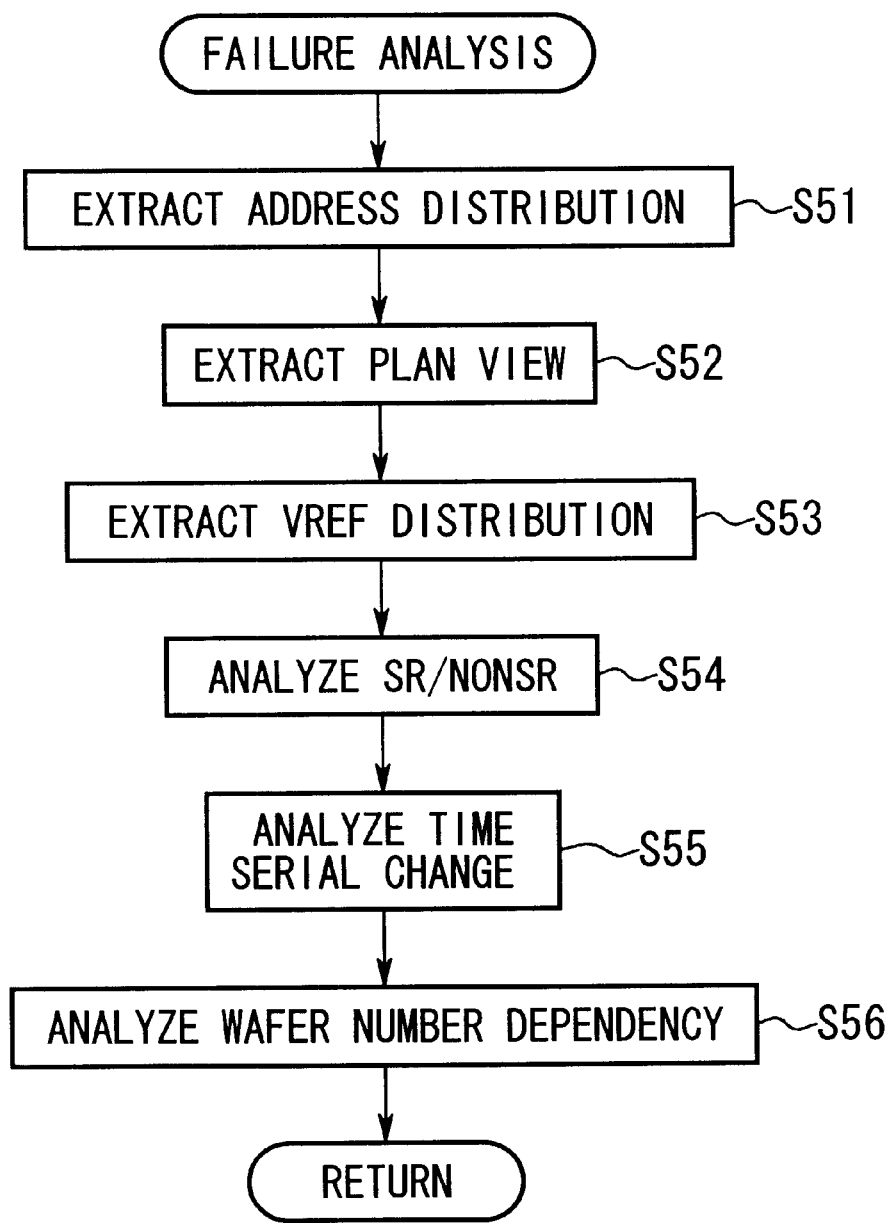
FIG. 21 is a flow chart showing the processing flow of statistical analysis based on the analysis data file of the present invention.

This failure analysis process will now be described using the flow chart of FIG. 21. This FIG. 21 is a flow chart for explaining the process of semiconductor memory failure analysis of the present invention.

In step S51, the process defect estimation device 34 generates a graph showing the number of replacements in the redundant memory region corresponding to each of the addresses of the word lines and bit lines shown in FIG. 15, from the replacement address information file 31.

Then, the process defect estimation device 34 judges the correlation between the failure pattern of the form in FIG. 15 stored in the defect distribution data base 35 and the analysis pattern of this Lot No. "CB-15" in FIG. 15.

In this manner, if the degree of correlation is high, the process defect estimation device 34 infers the process defect corresponding to this failure pattern in the defect distribution data base 35, and outputs text data showing this process defect as the result, to the display device 33.

Next, in step S52, from the replacement address information file 31, the defect distribution analyzer 32 generates an analysis pattern as a plan view figure (or a distribution figure, wherein each chip is colored with preset colors for each numerical value of the sum total value), wherein the sum total values shown in FIG. 16, being the total number of replacements in the chips at corresponding chip locations on each wafer for all of the wafers, are displayed in locations corresponding to each chip location on the image of the wafer.

Then, the process defect estimation device 34 judges the correlation between the failure pattern of the form in FIG. 15 stored in the defect distribution data base 35 and the analysis pattern of this Lot No. "CB-15" in FIG. 16. In this manner, if the degree of correlation is high, the process defect estimation device 34 infers the process defect corresponding to this failure pattern in the corresponding table, and outputs text data showing this process defect as the result, to the display device 33.

Next, from the replacement address information file 31, the defect distribution analyzer 32 obtains the sum total values wherein the total numbers of replacements at each chip location on the wafer is summed for all the even number wafers and odd number wafers in the lot.

The defect distribution analyzer 32 then generates an analysis pattern as a plan view figure (or a distribution figure, wherein each chip is colored with preset colors for each numerical value of the sum total value), wherein the even number wafers are shown in FIG. 17(*a*) and the odd number wafers in FIG. 17(*b*) with locations corresponding to each chip location on the image of the wafer.

The process defect estimation device 34 judges the correlation between the pair of failure patterns in FIG. 17(*a*) and FIG. 17(*b*) stored in the defect distribution data base 35, and the pair of analysis patterns for FIG. 17(*a*) and FIG. 17(*b*) of Lot No. "CB-15".

In this manner, if both of FIG. 17(*a*) and FIG. 17(*b*) have a high degree of correlation between the failure patterns and the analysis patterns, the process defect estimation device 34 infers the process defect corresponding to these failure patterns in this corresponding table and outputs text data showing this process defect as the result, to the display device 33.

Next in step S53, from the Vref FUSE numbers in the analysis data file, the defect distribution analyzer 32 obtains the reference voltage before correction for each chip and generates a bar graph showing the relationship between the reference voltage shown in FIG. 18 and the number of chips in the lot corresponding to this reference voltage.

The process defect estimation device 34, based on the analysis pattern of reference voltage Vref in the bar graph, analyses the difference in the threshold and displays text data showing the process steps (ion implantation steps, gate oxide film formation steps and the like) related to the difference in the threshold as an estimated result, on the display device 33.

Next, in step S54, the defect distribution analyzer 32 generates an analysis pattern showing the distribution of the count of chips that require correction of the self refresh timer cycle time as shown in FIG. 19, wherein from data indicating the disconnection of fuses for the self refresh timer in the replacement address information file 31, the chips that require correction of self refresh timer cycle times are retrieved and counted for each chip location on the whole wafer, and the total is displayed at the location corresponding to each chip location on the image of the wafer.

Then, the process defect estimation device 34 judges the correlation between the failure pattern of the form in FIG. 19 stored in the defect distribution data base 35 and the analysis pattern of this Lot No. "CB-15" in FIG. 19.

In this manner, if the degree of correlation is high, the process defect estimation device 34 infers the process defect corresponding to this failure pattern in the corresponding table, and outputs text data showing this process defect as the result to the display device 33.

Next, in step S55, the defect distribution analyzer 32 graphs the chronological change of defects as shown in FIG. 14. Then, based on the defect chronological change, the process defect estimation device 34 infers the process defects.

In step S56, the defect distribution analyzer 32 displays graphs as shown with patterns K and L (failure patterns). The process defect estimation device 34 can analyze whether the failures occurring in this lot are dependent on the wafer location or process sequence, and infers the process defect by the chronological change of the defects.

Then, the process defect estimation device 34 completes the failure analysis of step S5 shown in FIG. 21 and control proceeds to step S6 in FIG. 20.

Returning to FIG. 20, in step S6, the operator performs real failure analysis on the related process steps for the process defect estimated by the result that is output by the process defect estimation device 34. Then, the operator performs maintenance of the equipment associated with the process with the proved process defect.

In this manner, with the present invention, since chronological data of a plurality of lots is obtained by the line graph in FIG. 14, estimation of the process defect step can be performed in real time. In the case where a lot that was processed before the lot of the analysis object needs to be analyzed, the process defect can be estimated rapidly without having to collect fresh data from the chips, and feedback to the process can be performed in a timely manner. Therefore, the stability of the whole semiconductor memory chip wafer process can be improved, and hence there is an effect in that productivity is improved.

Next, in step S7, the defect distribution analyzer 32 writes a "red" point indicating that the total number of replacements is greater than or equal to the limit for performing failure analysis, and that failure analysis has been performed, in the location of Lot No. "CB-15" corresponding to the bar graph shown in FIG. 14, and completes the processing of the lot of this Lot No. "CB-15".

In this manner, by confirming the bar graph in FIG. 14, the operator can confirm at which point of time the failure analysis is performed, and can predict(or have the process defect estimation device 34 infer) to some degree the process defect that will occur next from the cyclical trend of this failure analysis, thus enabling early maintenance of equipment and the like while the process defects are insignificant.

Furthermore, with the present invention, even if the necessity of failure analysis occurs after assembly, since the analysis data file is accumulated chronologically and over a long period, it may not be necessary to use the LSI tester 1 to obtain fresh data from the semiconductor memories again, after being assembled into packages, in order to analyze the cause of the failure occurrence in the wafer process, and, hence the efficiency of failure analysis is improved.

Moreover, with the present invention, since the arrangement is such that process defects are estimated not only for defecty semiconductor memories but also nondefective products, it is possible to get a warning before a large amount of defecty product occurs.

Furthermore, by viewing the fail bitmaps of the first and the second prior arts for failure analysis, it is not possible to judge whether the semiconductor memory is in the range where fail bits can be replaced with redundant circuits, in other words whether it is able to be salvaged by redundant circuits. Whereas with the present invention, since the failure cause is estimated based on the number of replacements, the failure cause can be analyzed in relation to the location of defect cells and whether it is in the range capable of replacement, that is to say, whether it is capable of being shipped as a non-defective product. Moreover, since the ratio of the number of replacements to the total number of available replacements (hereunder referred to as replacement ratio) can be recognized, the process margin and stability can always be understood and the production line can be controlled. That is to say, if the replacement ratio is close to 100%, it is possible to predict that a slight process variation could cause a drop in the yield.

By feeding back the information of abnormal process steps obtained by the abovementioned failure analysis of the wafer process, it is possible to accelerate countermeasures for correcting abnormal process steps in the wafer process, and by using it at the start of a new process (development) or for process management of a currently used process, abnormal process steps can be detected early on, which is useful for process stability.

Furthermore, the replacement address decision device 2 has already been introduced in regard to fuse setting of the redundant circuits in semiconductor memory. Since the existing replacement address decision device 2 can be utilized to convert fail bitmap information into replacement address information, an expensive information processing device as in the second prior art does not need to be introduced, and defective cell information can be compressed for storage and analysis, hence enabling the estimation of process defects on that basis.

Moreover, with the present invention, since the analysis data files of each lot can be accumulated chronologically over a long period of time, then for quality control of each process step in the wafer process the processing time and date of each process step of the lot can be specified from lot numbers, and it is also possible to analyze the main elements of the process itself, such as environmental conditions, for investigating abnormalities of process steps causing failures.

In the above, an embodiment of the present invention has been described in detail with reference to the figures. However, the specific construction is not limited to this embodiment, and design changes and the like, within a scope that does not depart from the gist of the present invention, are also included in the present invention.

Furthermore, in the above description, an example is described in which the format of the fuse address data output to the trimming device 3 is converted to a replacement semiconductor memory address format by the replacement address analyzer 42. However, the replacement address determined by the replacement address decision device 2 may be output directly to the replacement address information file 31. With such a construction, the step for creating an intermediate file shown in FIG. 11 through FIG. 13 is not necessary.

In the present invention, the arrangement is such that: a semiconductor memory test is performed; bit addresses of fail bits are extracted from the bitmap showing pass (PASS) and fail (FAIL) judgment results corresponding to the addresses of memory cells of each semiconductor memory; replacement addresses of the word lines and bit lines that are replaced with redundant word lines and redundant bit lines are determined based on these bit addresses; and process defects are estimated by the number of replacements of replaced word lines and bit lines for each semiconductor memory and replaced locations based on these replacement addresses, or statistical analysis based on the distribution condition of each semiconductor on each wafer.

Therefore, with the present invention, the amount of memory data per wafer or per lot can be reduced in comparison with the case where bitmap data are stored for each chip.

That is to say, with the present invention, data that are required for process analysis of each lot can be contained within a small amount of information data in chronological order, and also the analysis data of each chip in a plurality of lots (lot numbers, wafer numbers, chip numbers, replaced word lines and bit lines for each chip, Vref FUSE numbers, fuse disconnection information of whether or not correction of the self refresh timer cycle time was required, and the like) can be stored as a history of lot processing in chronological order.

Furthermore, with the present invention, the abovementioned history enables the detection of process defect occurrences, the estimation of process defect occurrence tendencies, and the like.

Moreover, with the present invention, fresh data does not need to be obtained from semiconductor memories, and a large number of semiconductor memory chips can be utilized for analysis in a short period of time. Therefore, there is an effect in that the quality stability of the wafer process can be managed effectively.

What is claimed is:

1. A semiconductor memory production system comprising:
   a wafer manufacturing line for manufacturing a plurality of semiconductor memory chips on a wafer using a plurality of kinds of wafer manufacturing equipment,
   a wafer tester for testing the electrical characteristics of said chips;
   a replacement address decision device for determining replacement addresses in a redundant memory section installed in said semiconductor memory based on the test results of said wafer tester; and
   an estimation section for estimating the cause of failures based on results of statistical processing of said replacement addresses,
   wherein wafer manufacturing equipment causing failures is identified in said wafer manufacturing line and the cause of the failures is removed.

2. A semiconductor memory production system according to claim 1, wherein said estimation section is provided with a defect distribution analyzer for generating a replacement address distribution based on said replacement addresses, and
   a process defect estimation device for estimating process defects by comparing said replacement address distribution with previously stored defect distribution patterns.

3. A semiconductor memory production system according to claim 1, wherein there is provided a defect distribution analyzer for generating a replacement number for specific replacement addresses in said wafer.

4. A semiconductor memory production system according to claim 1, wherein there is provided a defect distribution analyzer for generating a history of said replacement number.

5. A semiconductor memory production system, wherein semiconductor memories manufactured on wafers are tested, the test results are statistically processed to infer the cause of failures, and the cause of the failures is removed from said wafer manufacturing equipment, wherein there is provided a semiconductor test section that tests said semiconductor memories and outputs a bitmap showing the fail or pass judgment result for the address of each memory cell in a semiconductor memory, a replacement address decision section that extracts the bit address of a fail bit from said bitmap and, based on this bit address, determines a replacement word line and/or bit line address to be replaced with a redundant word line and/or redundant bit line in a redundant memory section installed in said semiconductor memory and an estimation section for estimating process defects by statistical analysis based on the replacement number of the exchanged word lines or/and bit lines for each semiconductor memory, which is obtained based on said replacement addresses.

6. A semiconductor memory production system according to claim 1, wherein said estimation section is provided with a fuse address setting section for generating fuse addresses showing sections disconnected by fuses that set the addresses of the redundant word lines and/or redundant bit lines for said replacement addresses, and an extraction section for extracting a replacement number of the word lines and/or bit lines exchanged for each semiconductor memory from said fuse addresses, and the distribution condition of each semiconductor memory chip for each wafer.

7. A semiconductor memory production system according to claim 1, wherein said estimation portion is provided with a pattern formation section that indicates each semiconductor memory chip on said wafer with a color or gradation corresponding to said replacement number.

8. A semiconductor memory production system according to claim 1, wherein said estimation section compares said replacement number pattern with replacement number patterns stored in advance, which are generated for each process anomaly, and based on the result of this comparison estimates a particular process anomaly.

9. A semiconductor memory production method comprising:

a wafer processing step for forming a semiconductor memory on a wafer through a plurality of processes;

a wafer testing step for testing said wafer in the wafer state to select non-defective products;

a bit map outputting step for outputting, as a result of said testing, the addresses of memory cells of each semicinductor memory and a bit map showing the pass and fail determination of the addresses;

a replacement address decision step that extracts the bit address of a fail bit from said bitmap and, based on this bit address, determines a replacement word line and/or bit line address to be replaced with a redundant word line and/or redundant bit line in a redundant memory section installed in said semiconductor memory; and a process defect estimation step for estimating process defects by statistical analysis based on the replacement neumber of the replaced word lines or/and bit lines for each semiconductor memory, obtained based on said replacement addresses, or by the statistical analysis of the distribution states of the semiconductor memory in each wafer.

10. A semiconductor memory production method according to claim 9, wherein said process defect estimation step is provided with a fuse address setting section for generating fuse addresses showing sections disconnected by fuses that set the addresses of the redundant word lines and redundant bit lines for said replacement addresses, and an extraction step for extracting a replacement number of the word lines and bit lines exchanged for each semiconductor memory from said fuse address, and the distribution state of each semiconductor memory chip for each wafer.

11. A semiconductor memory production method according to claim 9, wherein said process defect estimation step is provided with a pattern formation portion that indicates each semiconductor memory chip on said wafer with a color or gradation corresponding to said replacement number.

12. A semiconductor memory production method according to claim 9, wherein said process defect estimation step compares said replacement number pattern with replacement number patterns stored in advance, which are generated for each process anomaly, and based on the result of this comparison estimates a particular process anomaly.

* * * * *